(12) United States Patent
Sumi et al.

(10) Patent No.: US 12,125,545 B2
(45) Date of Patent: Oct. 22, 2024

(54) SEMICONDUCTOR MEMORY DEVICE

(71) Applicant: Kioxia Corporation, Tokyo (JP)

(72) Inventors: Reiko Sumi, Yokohama Kanagawa (JP); Takashi Maeda, Kamakura Kanagawa (JP); Hidehiro Shiga, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 326 days.

(21) Appl. No.: 17/689,182

(22) Filed: Mar. 8, 2022

(65) Prior Publication Data

US 2023/0078441 A1 Mar. 16, 2023

(30) Foreign Application Priority Data

Sep. 10, 2021 (JP) ................. 2021-148135

(51) Int. Cl.
G11C 16/10 (2006.01)
G11C 16/04 (2006.01)
G11C 16/34 (2006.01)
G11C 16/08 (2006.01)

(52) U.S. Cl.
CPC ...... *G11C 16/3427* (2013.01); *G11C 16/0483* (2013.01); *G11C 16/10* (2013.01); *G11C 16/08* (2013.01)

(58) Field of Classification Search
CPC . G11C 16/3427; G11C 16/0483; G11C 16/10; G11C 16/30; G11C 16/08
See application file for complete search history.

(56) References Cited

U.S. PATENT DOCUMENTS

| 9,466,369 | B1* | 10/2016 | Pang ................. G11C 16/08 |
| 9,887,002 | B1* | 2/2018 | Zhang ................ G11C 16/08 |
| 11,139,037 | B2 | 10/2021 | Maeda |
| 11,164,888 | B2* | 11/2021 | Futatsuyama ......... H10B 43/27 |
| 11,264,106 | B2 | 3/2022 | Maejima et al. |
| 2016/0260483 | A1* | 9/2016 | Shano ................ G11C 29/848 |
| 2017/0271021 | A1 | 9/2017 | Futatsuyama et al. |
| 2018/0277565 | A1* | 9/2018 | Futatsuyama ......... G11C 16/10 |
| 2020/0098432 | A1* | 3/2020 | Shirakawa ............ H10B 41/27 |
| 2020/0273500 | A1* | 8/2020 | Takada ................. H10B 43/35 |
| 2021/0295916 | A1 | 9/2021 | Li |

(Continued)

FOREIGN PATENT DOCUMENTS

| JP | 2017168163 A | 9/2017 |
| JP | 2021149986 A | 9/2021 |
| JP | 2022144318 A | 10/2022 |

*Primary Examiner* — Hoai V Ho
*Assistant Examiner* — Justin Bryce Heisterkamp
(74) *Attorney, Agent, or Firm* — Holtz, Holtz & Volek PC

(57) ABSTRACT

A semiconductor memory device includes a driver that, in a write operation, applies a first voltage to a first select gate line, applies a second voltage lower than the first voltage to a second select gate line, applies a third voltage equal to or higher than the first voltage to a first dummy word line on an uppermost layer, applies a fourth voltage different from the third voltage and higher than the second voltage to a second dummy word line on an uppermost layer, applies a fifth voltage equal to or higher than the third voltage to a first dummy word line on a lowermost layer, and applies a sixth voltage different from the fifth voltage and equal to or higher than the fourth voltage to a second dummy word line on a lowermost layer.

11 Claims, 25 Drawing Sheets

(56) References Cited

U.S. PATENT DOCUMENTS

2022/0208247 A1\* 6/2022 Inuzuka .................. G11C 16/10
2022/0215883 A1\* 7/2022 Song ...................... H10B 43/27
2022/0301636 A1 9/2022 Sano et al.

\* cited by examiner

SEMICONDUCTOR MEMORY DEVICE

CROSS-REFERENCE TO RELATED APPLICATION

This application is based upon and claims the benefit of priority from Japanese Patent Application No. 2021-148135, filed on Sep. 10, 2021, the entire contents of which are incorporated herein by reference.

FIELD

Embodiments described herein relate generally to a semiconductor memory device.

BACKGROUND

A NAND flash memory is known as a non-volatile semiconductor memory device.

DETAILED DESCRIPTION

Figure 1:
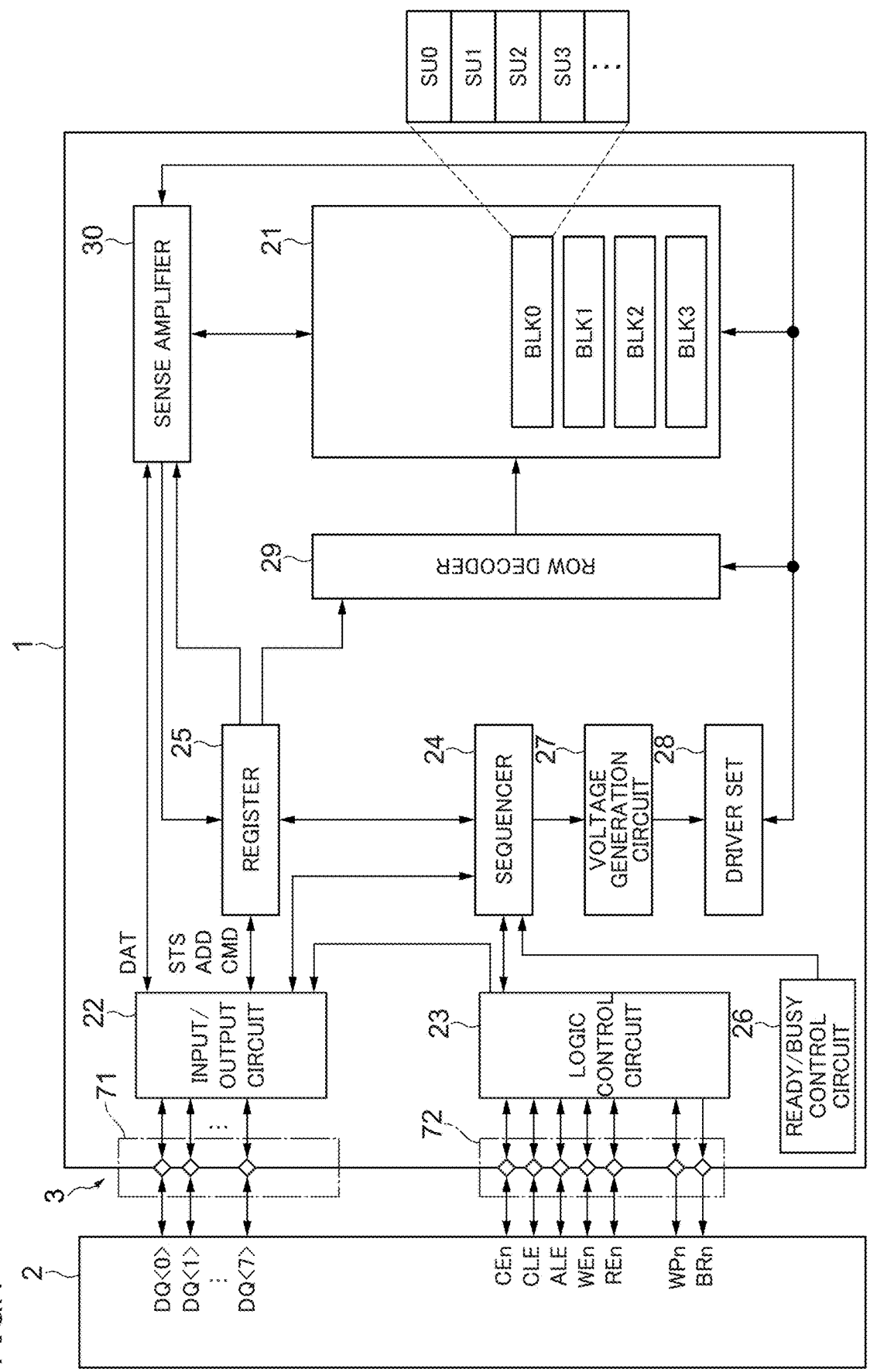
FIG. 1 is a block diagram showing the configuration of a memory system including a semiconductor memory device according to a first embodiment.

A semiconductor memory device of embodiments includes: a substrate; a memory pillar extending in a first direction from the substrate; a plurality of first word lines provided above the substrate so as to be spaced from the substrate in the first direction and be in parallel to a substrate surface of the substrate and facing a first side of the memory pillar; a plurality of second word lines provided above the substrate so as to be spaced from the substrate in the first direction and be in parallel to the substrate surface of the substrate and facing a second side of the memory pillar, and positions of the second word lines in the first direction being the same as positions of the first word lines in the first direction; a plurality of first dummy word lines provided above the first word lines in parallel to the substrate surface of the substrate and facing the first side of the memory pillar; a plurality of second dummy word lines provided above the second word lines in parallel to the substrate surface of the substrate and facing the second side of the memory pillar, and positions of the second dummy word lines in the first direction being the same as positions of the first dummy word lines in the first direction; a first select gate line provided above the first dummy word lines in parallel to the substrate surface of the substrate and facing the first side of the memory pillar; a second select gate line provided above the second dummy word lines in parallel to the substrate surface of the substrate and facing the second side of the memory pillar, and a position of the second select gate line in the first direction being the same as a position of the first select gate line in the first direction; and a driver for supplying a voltage, wherein, in a write operation, the driver applies a first voltage to the first select gate line, applies a second voltage lower than the first voltage to the second select gate line, applies a third voltage equal to or higher than the first voltage to the first dummy word line on an uppermost layer, applies a fourth voltage different from the third voltage and higher than the second voltage to the second dummy word line on an uppermost layer, applies a fifth voltage equal to or higher than the third voltage to the first dummy word line on a lowermost layer, and applies a sixth voltage different from the fifth voltage and equal to or higher than the fourth voltage to the second dummy word line on a lowermost layer.

Hereinafter, embodiments will be described with reference to the diagrams. In addition, in the diagrams, the same or similar elements are denoted by the same or similar reference numerals.

First Embodiment

FIG. 1 is a block diagram showing an example of the configuration of a memory system 3 including a semiconductor memory device 1 according to a first embodiment. The configuration of the memory system 3 including the semiconductor memory device 1 according to the first embodiment is not limited to the configuration shown in FIG. 1.

As shown in FIG. 1, the memory system 3 includes the semiconductor memory device 1 and a memory controller 2. The memory system 3 is, for example, a memory card such as an SSD (solid state drive) or an SD™ card. The memory system 3 may include a host device (not shown).

The semiconductor memory device 1 is connected to, for example, the memory controller 2, and is controlled by using the memory controller 2. The memory controller 2 receives, for example, an instruction necessary for the operation of the semiconductor memory device 1 from the host device, and transmits the instruction to the semiconductor memory device 1. The memory controller 2 transmits the instruction to the semiconductor memory device 1 to control the reading of data from the semiconductor memory device 1, writing of data into the semiconductor memory device 1, or erasing data in the semiconductor memory device 1. In embodiments, the semiconductor memory device 1 is, for example, a NAND flash memory.

As shown in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier 30, an input/output pad group 71, and a logic control pad group 72. In the semiconductor memory device 1, various operations, such as a write operation for storing write data DAT in the memory cell array 21 and a read operation for reading read data DAT from the memory cell array 21, are executed. The configuration of the semiconductor memory device 1 according to embodiments is not limited to the configuration shown in FIG. 1.

The memory cell array 21 is connected to, for example, the sense amplifier 30, the row decoder 29, and the driver set 28. The memory cell array 21 includes blocks BLK0, BLK1, . . . , BLKn (n is an integer of 1 or more). Although details will be described later, each block BLK includes a plurality of string units SU (SU0, SU1, SU2, . . . ). Each of the string units SU includes a plurality of non-volatile memory cells associated with bit lines and word lines. The block BLK is, for example, a data erasing unit. Data held by memory cell transistors MT (FIG. 2) included in the same block BLK is collectively erased.

In the semiconductor memory device 1, for example, a TLC (triple-level cell) method or a QLC (quadruple level cell) method can be applied. In the TLC method, 3-bit data is held in each memory cell, and in the QLC method, 4-bit data is held in each memory cell. In addition, data of 2 bits or less may be held in each memory cell, or data of 5 bits or more may be held in each memory cell.

The input/output circuit 22 is connected to, for example, the register 25, the logic control circuit 23, and the sense amplifier 30. The input/output circuit 22 controls the transmission and reception of a data signal DQ<7:0> between the memory controller 2 and the semiconductor memory device 1.

The data signal DQ<7:0> is an 8-bit signal. The data signal DQ<7:0> is an entity of data transmitted and received between the semiconductor memory device 1 and the memory controller 2, and includes a command CMD, data DAT, address information ADD, status information STS, and the like. The command CMD includes, for example, an instruction for executing an instruction transmitted from the host device (memory controller 2) to the semiconductor memory device 1. The data DAT includes the data DAT written into the semiconductor memory device 1 or the data DAT read from the semiconductor memory device 1. The address information ADD includes, for example, a column address and a row address for selecting a plurality of non-volatile memory cells associated with bit lines and word lines. The status information STS includes, for example, information regarding the status of the semiconductor memory device 1 regarding the write operation and the read operation.

More specifically, the input/output circuit 22 includes an input circuit and an output circuit, and the input circuit and the output circuit perform processing described below. The input circuit receives the write data DAT, the address information ADD, and the command CMD from the memory controller 2. The input circuit transmits the received write data DAT to the sense amplifier 30, and transmits the received address information ADD and command CMD to the register 25. On the other hand, the output circuit receives the status information STS from the register 25, and receives the read data DAT from the sense amplifier 30. The output circuit transmits the received status information STS and read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the received signals.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address information ADD. The write enable signal WEn and the read enable signal REn are, for example, signals for instructing the input/output circuit 22 to input and output the data signal DQ, respectively. The write protect signal WPn is a signal for instructing the semiconductor memory device 1 to prohibit writing and erasing of data.

The sequencer 24 is connected to, for example, the ready/busy control circuit 26, the sense amplifier 30, and the driver set 28. The sequencer 24 controls the overall operation of the semiconductor memory device 1 based on the command CMD held in the command register. For example, the sequencer 24 controls the sense amplifier 30, the row decoder 29, the voltage generation circuit 27, the driver set 28, and the like to execute various operations, such as a write operation and a read operation.

The register 25 includes, for example, a status register (not shown), an address register (not shown), a command register (not shown), and the like. The status register receives the status information STS from the sequencer 24, holds the status information STS, and transmits the status information STS to the input/output circuit 22 based on the instruction of the sequencer 24. The address register receives the address information ADD from the input/output circuit 22 and holds the address information ADD. The address register transmits a column address in the address information ADD to the sense amplifier 30, and transmits a row address in the address information ADD to the row decoder 29. The command register receives the command CMD from the input/output circuit 22, holds the command CMD, and transmits the command CMD to the sequencer 24.

The ready/busy control circuit 26 generates a ready/busy signal R/Bn according to the control of the sequencer 24, and transmits the generated ready/busy signal R/Bn to the memory controller 2. The ready/busy signal R/Bn is a signal for notifying whether the semiconductor memory device 1 is in a ready state in which an instruction from the memory controller 2 is accepted or in a busy state in which no instruction is accepted.

The voltage generation circuit 27 is connected to, for example, the driver set 28 or the like. The voltage generation circuit 27 generates a voltage used for a write operation, a read operation, and the like based on the control of the sequencer 24, and supplies the generated voltage to the driver set 28.

Figure 12:
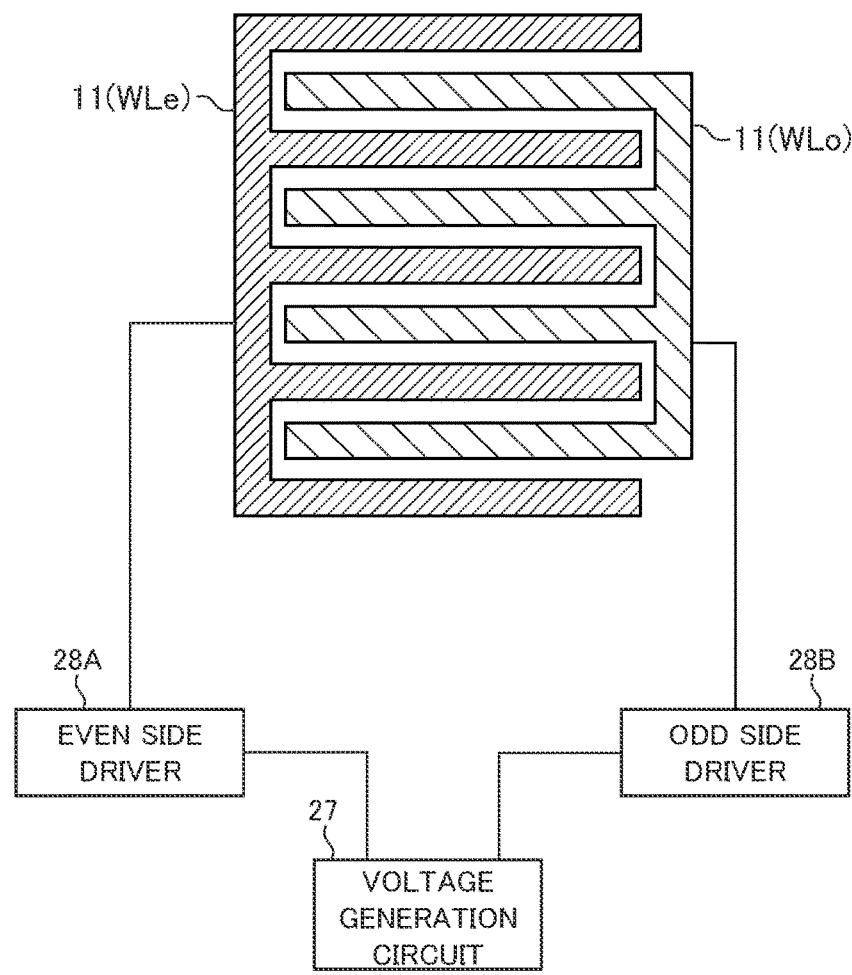
FIG. 12 is a diagram for explaining the electrical connection of a voltage generation circuit, a driver set, a select gate line, or a word line according to the first embodiment.

The driver set 28 includes, for example, an even side driver 28A (FIG. 12) and an odd side driver 28B (FIG. 12). The driver set 28 is connected to the memory cell array 21, the sense amplifier 30, and the row decoder 29. Based on the voltage supplied from the voltage generation circuit 27, the driver set 28 generates various voltages to be applied to a select gate line SGD (FIG. 2), a word line WL (FIG. 2), a source line SL (FIG. 2), and the like in various operations such as a read operation and a write operation, for example. The driver set 28 supplies the generated voltage to the even side driver 28A, the odd side driver 28B, the sense amplifier 30, the row decoder 29, the source line SL, and the like.

The row decoder 29 receives a row address from the address register and decodes the received row address. The row decoder 29 selects a block BLK, in which various operations such as a read operation and a write operation are to be executed, based on the decoding result. The row decoder 29 can supply the voltage supplied from the driver set 28 to the selected block BLK.

The sense amplifier 30 receives a column address from the address register and decodes the received column address, for example. In addition, the sense amplifier 30 executes an operation of transmitting and receiving the data DAT between the memory controller 2 and the memory cell array 21 based on the decoding result. The sense amplifier 30 includes, for example, a sense amplifier unit (not shown) provided for each bit line. The sense amplifier 30 makes it possible to supply a voltage to the bit line BL by using the sense amplifier unit. For example, the sense amplifier 30 can supply a voltage to a bit line by using a sense amplifier unit. In addition, the sense amplifier 30 senses the data read from the memory cell array 21, generates the read data DAT, and transmits the generated read data DAT to the memory controller 2 through the input/output circuit 22. In addition, the sense amplifier 30 receives the write data DAT from the memory controller 2 through the input/output circuit 22, and transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transmits the chip enable signal CEn, the command latch enable signal CLE, the address latch enable signal ALE, the write enable signal WEn, and the read enable signal REn received from the memory controller 2 to the logic control circuit 23. The logic control pad group 72 transmits the ready/busy signal R/Bn received from the ready/busy control circuit 26 to the memory controller 2.

Figure 2:
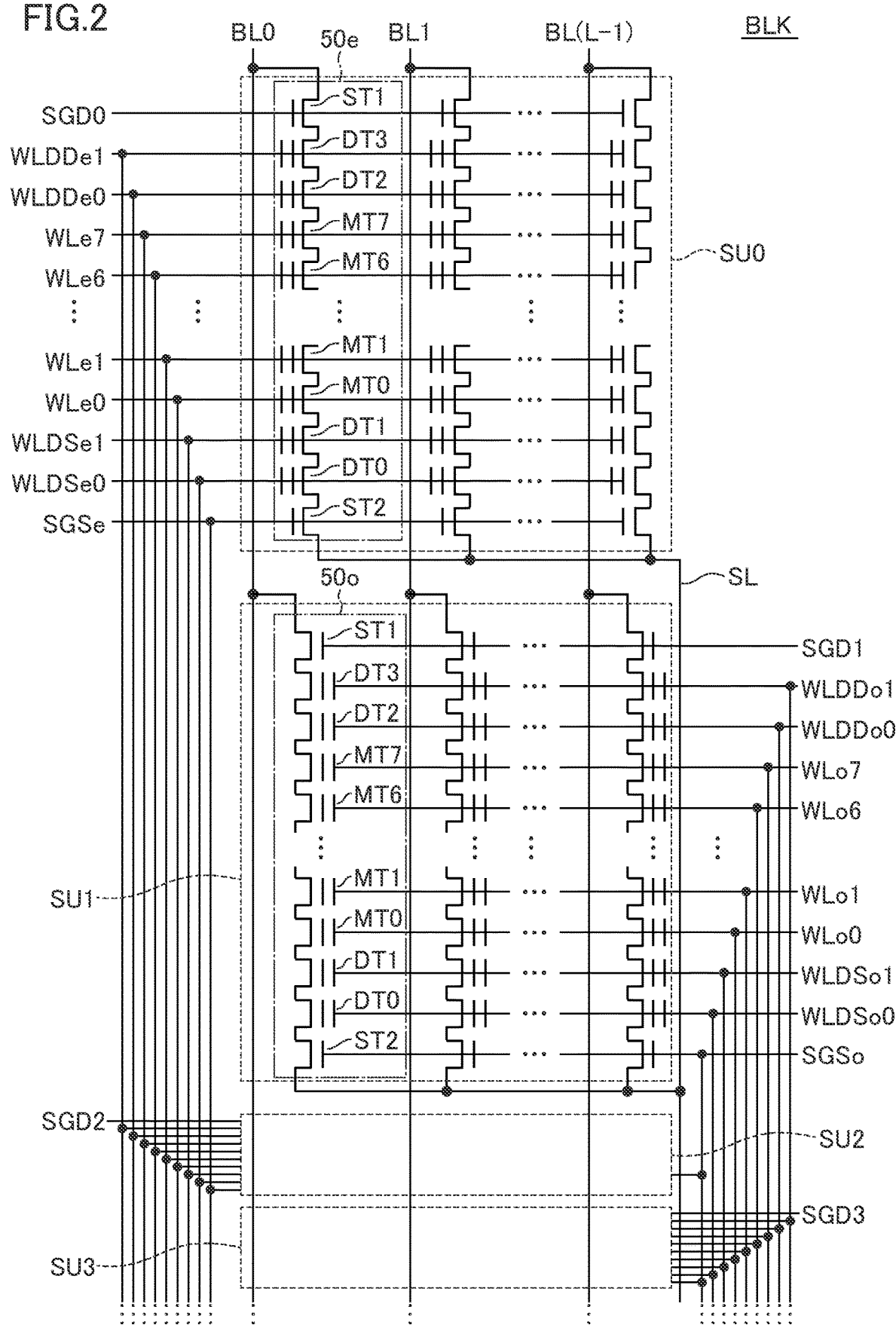
FIG. 2 is a schematic diagram showing the circuit configuration of a memory cell array in the semiconductor memory device according to the first embodiment.

FIG. 2 is an example of the circuit configuration of the memory cell array 21 shown in FIG. 1. FIG. 2 is a diagram showing the circuit configuration of one block BLK among a plurality of blocks BLK included in the memory cell array 21. For example, each of the plurality of blocks BLK included in the memory cell array 21 has the circuit configuration shown in FIG. 2. The configuration of the memory cell array 21 according to embodiments is not limited to the configuration shown in FIG. 2. In the description of FIG. 2, the description of the same or similar configuration as that of FIG. 1 may be omitted.

As shown in FIG. 2, the block BLK includes a plurality of string units SU (SU0, SU1, SU2, and SU3). In embodiments, the write operation and the read operation are executed in units of the string unit SU (page). Each of the string units SU includes a plurality of NAND strings 50. For example, the string units SU0 and SU2 include a plurality of NAND strings 50$e$, and the string units SU1 and SU3 include a plurality of NAND strings 50$o$. In addition, although FIG. 2 shows an example in which each block BLK includes four string units SU0, SU1, SU2, and SU3, the number of string units included in each block is not limited to four. For example, each block BLK may include 6 or more string units.

Each of the NAND strings 50 includes, for example, eight memory cell transistors MT (MT0 to MT7), four dummy transistors DT0, DT1, DT2 and DT3, and selection transistors ST1 and ST2. Each memory cell transistor MT includes a control gate and a charge storage layer, and holds data in a non-volatile manner. The dummy transistors DT are connected in series between the source of the selection transistor ST1 and the drain of the selection transistor ST2, with the memory cell transistors MT being connected in series between the drain of the dummy transistor DT1 and the source of the dummy transistor DT2.

The gate of the selection transistor ST1 in each of the string units SU is connected to the select gate line SGD (SGD0, SGD1, . . . ). The select gate line SGD is independently controlled by the row decoder 29. In addition, the gate of the selection transistor ST2 in each of the even-numbered string units SUe (SU0, SU2, . . . ) is connected to, for example, an even-numbered select gate line SGSe, and the gate of the selection transistor ST2 in each of the odd-numbered string unit SUo (SU1, SU3, . . . ) is connected to, for example, an odd-numbered select gate line SGSo. The even-numbered select gate line SGSe and the odd-numbered select gate line SGSo may be connected to each other so as to be controlled in the same manner, or may be independently provided so as to be independently controllable.

The control gates of the memory cell transistors MT (MT0 to MT7) included in the string unit SUe in the same block BLK are commonly connected to a word line WLe (WLe0 to WLe7). The control gates of the memory cell transistors MT (MT0 to MT7) included in the string unit SUo in the same block BLK are commonly connected to a word line WLo (WLo0 to WLo7). The select gate line SGSe and the select gate line SGSo are independently controlled by the row decoder 29.

The control gates of the dummy transistors DT0, DT1, DT2 and DT3 included in the string unit SUe in the same block BLK are commonly connected to dummy word lines WLDSe0, WLDSe1, WLDDe0, and WLDDe1. The control gates of the dummy transistors DT0, DT1, DT2 and DT3 included in the string unit SUo in the same block BLK are commonly connected to dummy word lines WLDSo0, WLDSo1, WLDDo0, and WLDDo1. The dummy word lines WLDSo0, WLDSo1, WLDDo0, and WLDDo1 are independently controlled by the row decoder 29.

The drains of the selection transistors ST1 of the NAND strings 50 in the same row in the memory cell array 21 are commonly connected to the bit line BL (BL0 to BL (L-1), where (L-1) is a natural number of 2 or more). That is, in the bit line BL, the NAND string 50 is commonly connected between the plurality of string units SU. The sources of the plurality of selection transistors ST2 are commonly connected to the source line SL. For example, the source line SL is electrically connected to the driver set 28, and a voltage is supplied from the voltage generation circuit 27 or the driver set 28 under the control of the voltage generation circuit 27 and the driver set 28 using the sequencer 24. In addition, the semiconductor memory device 1 according to embodiments may include a plurality of source lines SL. For example, each of the plurality of source lines SL may be electrically connected to the driver set 28, so that different voltages are supplied from the voltage generation circuit 27 or the driver set 28 to each of the plurality of source lines SL under the control of the voltage generation circuit 27 and the driver set 28 using the sequencer 24.

The string unit SU includes a plurality of NAND strings 50 connected to different bit lines BL and connected to the same select gate line SGD. The block BLK includes a plurality of string units SU having the common word line WL. The memory cell array 21 includes a plurality of blocks BLK having the common bit line BL. In the memory cell array 21, the above-described select gate line SGS, dummy word line WLDS, word line WL, dummy word line WLDD, and select gate line SGD are stacked above the source line layer, and the memory cell transistor MT is stacked in a three-dimensional manner.

Figure 3:
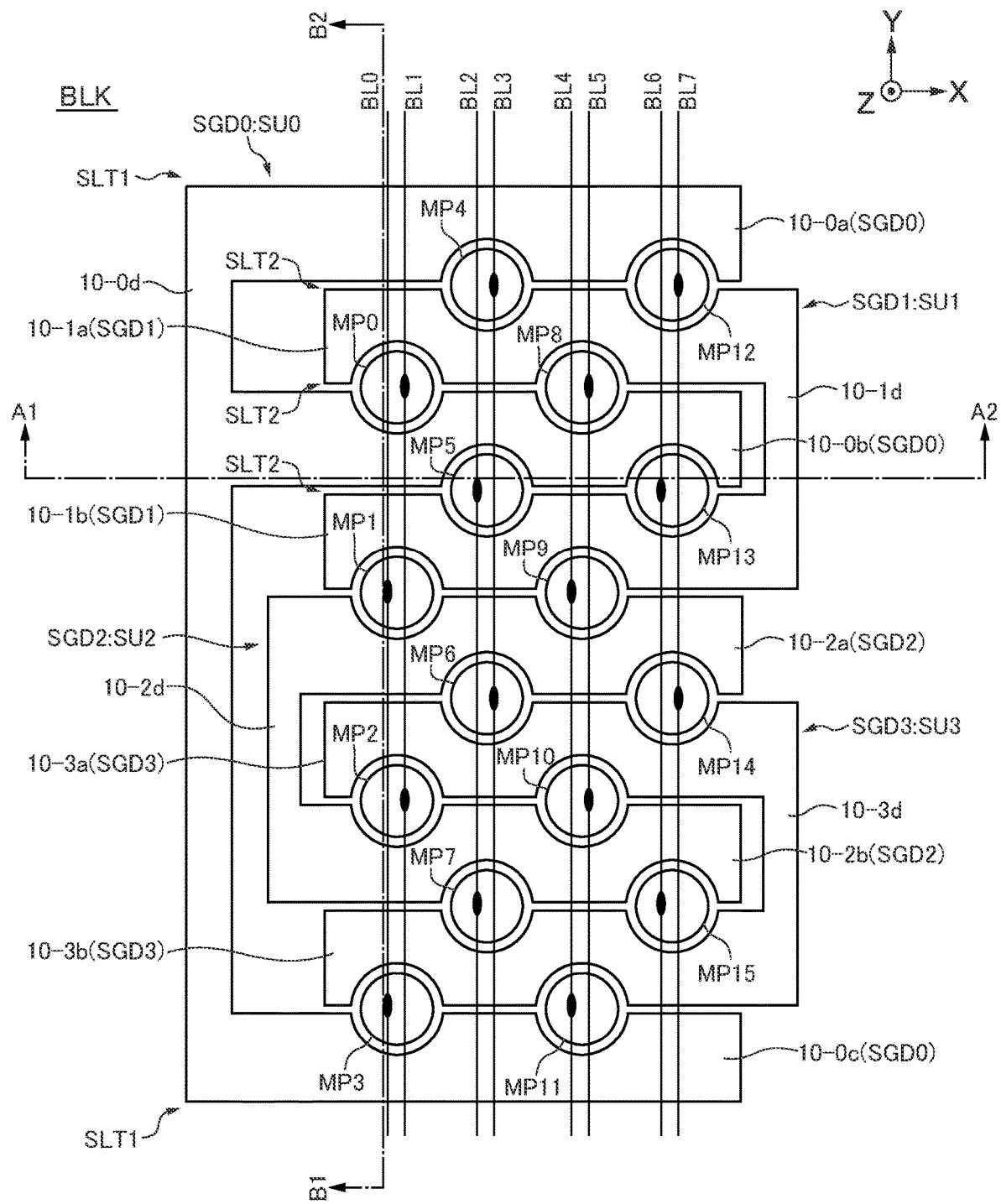
FIG. 3 is a schematic diagram showing the planar layout of select gate lines, bit lines, and memory pillars according to the first embodiment.

FIG. 3 is a diagram showing the planar layout of the select gate lines SGD on a plane (XY plane) parallel to the source line layer of a predetermined block BLK. As shown in FIG. 3, in the semiconductor memory device 1 according to embodiments, for example, four select gate lines SGD are included in one block BLK. The planar layout of the select gate lines SGD according to embodiments is not limited to the layout shown in FIG. 3. In the description of FIG. 3, the description of the same or similar configuration as that of FIGS. 1 and 2 may be omitted.

As shown in FIG. 3, in the semiconductor memory device 1 according to embodiments, for example, three wiring layers 10-0a, 10-0b, and 10-0c extending in the X direction are connected to each other using a first connection portion 10-0d extending in the Y direction. The wiring layers 10-0a and 10-0c are located at both ends in the Y direction. The wiring layer 10-0a and the wiring layer 10-0b are adjacent to each other in the Y direction with another wiring layer (wiring layer 10-1a) interposed between the wiring layer 10-0a and the wiring layer 10-0b. The first connection portion 10-0d is located at one end in the X direction. The three wiring layers 10-0a, 10-0b, and 10-0c function as the select gate line SGD0. In embodiments, for example, the Y direction is a direction perpendicular or approximately perpendicular to the X direction.

The wiring layers 10-1a and 10-1b extending in the X direction are connected to each other using a second connection portion 10-1d extending in the Y direction. The wiring layer 10-1a is located between the wiring layers 10-0a and 10-0b. The wiring layer 10-1b is located between the wiring layer 10-0b and another wiring layer (wiring layer 10-2a). The second connection portion 10-1d is located at the other end of the first connection portion 10-0d on the opposite side in the X direction. The two wiring layers 10-1a and 10-1b function as the select gate line SGD1.

The wiring layers 10-2a and 10-2b extending in the X direction are connected to each other by a first connection portion 10-2d extending in the Y direction. Similarly, wiring layers 10-3a and 10-3b extending in the X direction are connected to each other by a second connection portion 10-3d extending in the Y direction. The wiring layer 10-2a is located between the wiring layer 10-1b and the wiring layer 10-3a. The wiring layer 10-3a is located between the wiring layer 10-2a and the wiring layer 10-2b. The wiring layer 10-2b is located between the wiring layer 10-3a and the wiring layer 10-3b. The wiring layer 10-3b is located between the wiring layer 10-2b and the wiring layer 10-0c. The first connecting portion 10-2d is located at one end on the same side as the first connecting portion 10-0d in the X direction. The second connection portion 10-3d is located at the other end of the first connecting portion 10-0d on the opposite side in the X direction. The two wiring layers 10-2a and 10-2b function as the select gate line SGD2. The two wiring layers 10-3a and 10-3b function as the select gate line SGD3.

In embodiments, a configuration is exemplified in which the respective wiring layers are connected to each other by using the first connection portions 10-0d and 10-2d or the second connection portions 10-1d and 10-3d. However, embodiments are not limited to this configuration. For example, each wiring layer is independent, and is controlled such that the same voltage is supplied to the wiring layers 10-0a, 10-0b, and 10-0c, the same voltage is supplied to the wiring layers 10-1*a* and 10-1*b*, the same voltage is supplied to the wiring layers 10-2*a* and 10-2*b*, and the same voltage is supplied to the wiring layers 10-3*a* and 10-3*b*.

The string unit SU including the NAND string 50*e* of a memory pillar MP adjacent to the wiring layers 10-0*a*, 10-0*b*, and 10-0*c* is called SU0. The string unit SU including the NAND string 50*o* of the memory pillar MP adjacent to the wiring layers 10-1*a* and 10-1*b* is called SU1. The string unit SU including the NAND string 50*e* of the memory pillar MP adjacent to the wiring layers 10-2*a* and 10-2*b* is called SU2. The string unit SU including the NAND string 50*o* of the memory pillar MP adjacent to the wiring layers 10-3*a* and 10-3*b* is called SU3.

The wiring layers 10 adjacent to each other in the Y direction in the block BLK are insulated. The region that insulates the adjacent wiring layers 10 from each other is called a slit SLT2. In the slit SLT2, for example, a region from a surface parallel to the source line layer to at least a layer in which the wiring layer 10 is provided is embedded by using an insulating film (not shown). In addition, in the memory cell array 21, for example, a plurality of blocks BLK shown in FIG. 3 are arranged in the Y direction. Similar to the wiring layers 10 adjacent to each other in the Y direction in the block BLK, a region between the blocks BLK adjacent to each other in the Y direction is embedded by using an insulating film (not shown), thereby insulating the blocks BLK adjacent to each other in the Y direction from each other. The region that insulates the adjacent blocks BLK from each other is called a slit SLT1. Similar to the slit SLT2, in the slit SLT1, a region from a surface parallel to the source line layer to at least a layer in which the wiring layer 10 is provided is embedded by the insulating film.

A plurality of memory pillars MP (MP0 to MP15) are provided between the wiring layers 10 adjacent to each other in the Y direction. The plurality of memory pillars MP are provided in a memory cell portion. Each of the plurality of memory pillars MP is provided along the Z direction. In embodiments, for example, the Z direction is a direction perpendicular or approximately perpendicular to the X and Y directions, and is a direction perpendicular or approximately perpendicular to the direction parallel to the source line layer. The Z direction is an example of the first direction. The Y direction is an example of the second direction.

Specifically, the memory pillars MP4 and MP12 are provided between the wiring layers 10-0*a* and 10-1*a*. The memory pillars MP0 and MP8 are provided between the wiring layers 10-1*a* and 10-0*b*. The memory pillars MP5 and MP13 are provided between the wiring layers 10-0*b* and 10-1*b*. The memory pillars MP1 and MP9 are provided between the wiring layers 10-1*b* and 10-2*a*. The memory pillars MP6 and MP14 are provided between the wiring layers 10-2*a* and 10-3*a*. The memory pillars MP2 and MP10 are provided between the wiring layers 10-3*a* and 10-2*b*. The memory pillars MP7 and MP15 are provided between the wiring layers 10-2*b* and 10-3*b*. The memory pillars MP3 and MP11 are provided between the wiring layers 10-3*b* and 10-0*c*.

The memory pillar MP is a structure that forms the selection transistors ST1 and ST2, the dummy transistors DT0, DT1, DT2, and DT3, and the memory cell transistor MT. The detailed structure of the memory pillar MP will be described later.

The memory pillars MP0 to MP3 are arranged along the Y direction. The memory pillars MP8 to MP11 are arranged along the Y direction at positions adjacent to the memory pillars MP0 to MP3 in the X direction. That is, the memory pillars MP0 to MP3 and the memory pillars MP8 to MP11 are arranged in parallel.

The memory pillars MP4 to MP7 and the memory pillars MP12 to MP15 are arranged along the Y direction. The memory pillars MP4 to MP7 are located between the memory pillars MP0 to MP3 and the memory pillars MP8 to MP11 in the X direction. The memory pillars MP12 to MP15 are located so as to interpose the memory pillars MP8 to MP11 between the memory pillars MP12 to MP15 and the memory pillars MP4 to MP7 in the X direction. That is, the memory pillars MP4 to MP7 and the memory pillars MP12 to MP15 are arranged in parallel.

The two bit lines BL0 and BL1 are provided above the memory pillars MP0 to MP3. The bit line BL0 is commonly connected to the memory pillars MP1 and MP3. The bit line BL1 is commonly connected to the memory pillars MP0 and MP2. The two bit lines BL2 and BL3 are provided above the memory pillars MP4 to MP7. The bit line BL2 is commonly connected to the memory pillars MP5 and MP7. The bit line BL3 is commonly connected to the memory pillars MP4 and MP6.

The two bit lines BL4 and BL5 are provided above the memory pillars MP8 to MP11. The bit line BL4 is commonly connected to the memory pillars MP9 and MP11. The two bit lines BL6 and BL7 are provided above the memory pillars MP12 to MP15. The bit line BL6 is commonly connected to the memory pillars MP13 and MP15. The bit line BL7 is commonly connected to the memory pillars MP12 and MP14.

As described above, the memory pillar MP is provided at a position across two adjacent wiring layers 10 in the Y direction, and is provided so as to be embedded in a part of one of the plurality of slits SL2. In addition, each slit SLT2 is provided between two memory pillars MP which are adjacent to each other in the Y direction, and/or extends between two memory pillars MP which are adjacent to each other in the X direction.

In addition, the memory pillar MP is not provided between the wiring layers 10-0*a* and the wiring layers 10-0*c* which are adjacent to each other along the Y direction and between which the slit SLT1 is interposed.

Figure 4:
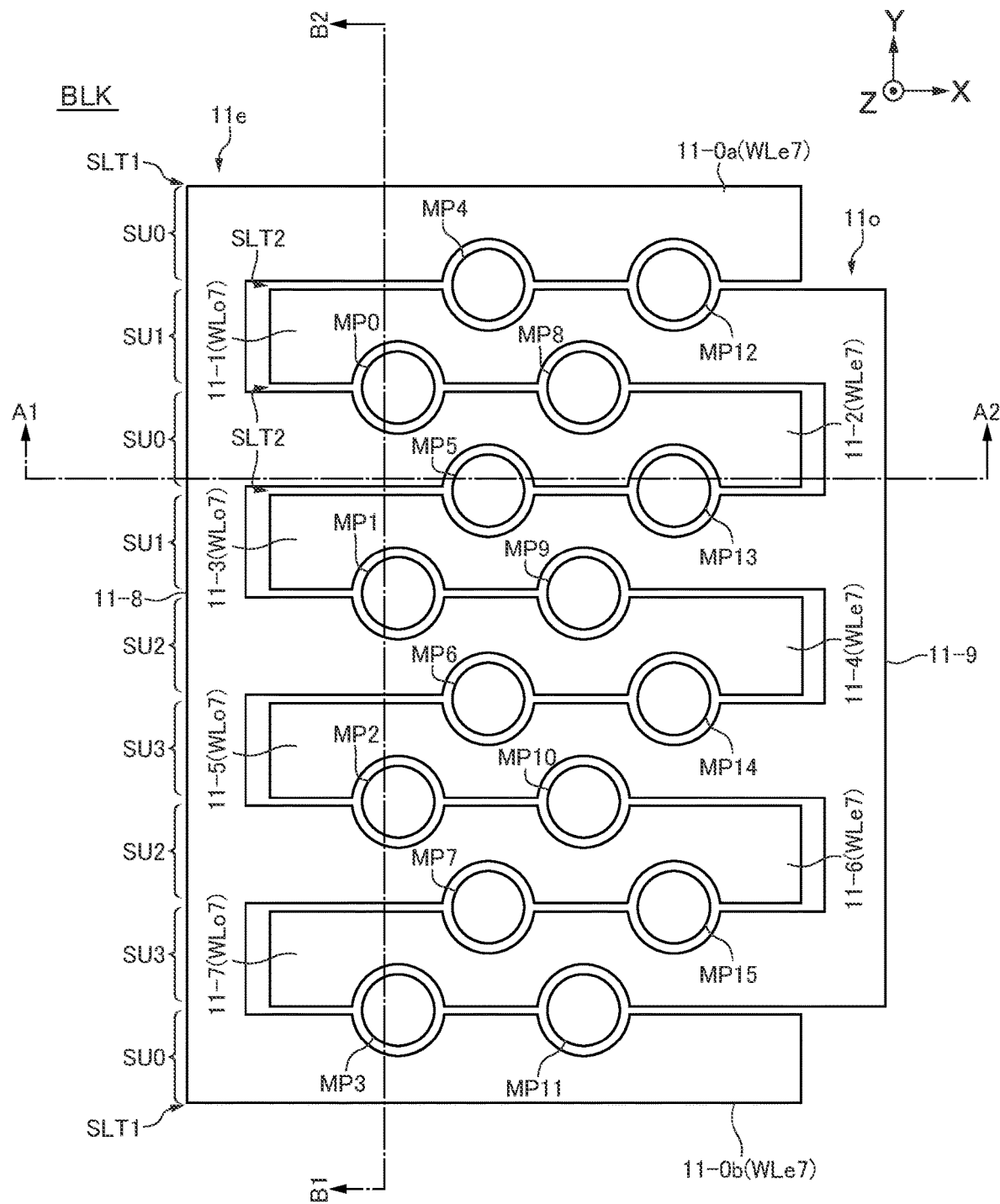
FIG. 4 is a schematic diagram showing the planar layout of word lines and memory pillars according to the first embodiment.

FIG. 4 is a diagram showing the planar layout of the word lines WL on the XY plane. The layout shown in FIG. 4 corresponds to the layout of a region of one block in FIG. 3, and is the layout of a wiring layer 11 provided below the wiring layer 10 shown in FIG. 3. The planar layout of the word lines WL according to embodiments is not limited to the layout shown in FIG. 4. In the description of FIG. 4, the description of the same or similar configuration as that of FIGS. 1 to 3 may be omitted.

As shown in FIG. 4, nine wiring layers 11 (wiring layers 11-0 to 11-7, where the wiring layer 11-0 includes a wiring layer 11-0*a* and a wiring layer 11-0*b*) extending in the X direction are arranged along the Y direction. The wiring layers 11-0 to 11-7 are arranged below the wiring layers 10-0 to 10-7 in the Z direction. An insulating film is provided between the wiring layers 11-0 to 11-7 and the wiring layers 10-0 to 10-7, so that the wiring layers 11-0 to 11-7 and the wiring layers 10-0 to 10-7 are insulated from each other.

Each wiring layer 11 functions as a word line WL7. The other word lines WL0 to WL6 also have the same configuration and function as the word line WL7. In the example shown in FIG. 4, the wiring layers 11-0*a*, 11-2, 11-4, 11-6, and 11-0*b* function as the word line WLe7. The wiring layers 11-0*a*, 11-2, 11-4, 11-6, and 11-0*b* are connected to each other using a first connection portion 11-8 extending in the Y direction. The first connecting portion 11-8 is provided at one end in the X direction. In the first connection portion 11-8, the wiring layers 11-0a, 11-2, 11-4, 11-6, and 11-0b are connected to the row decoder 29. In embodiments, the first connection portion 11-8 and the wiring layers 11-0a, 11-2, 11-4, 11-6, and 11-0b may be collectively referred to as a wiring layer 11e.

In addition, the wiring layers 11-1, 11-3, 11-5, and 11-7 function as the word line WLo7. The wiring layers 11-1, 11-3, and 11-5 and the wiring layer 11-7 are connected to each other using a second connection portion 11-9 extending in the Y direction. The second connection portion 11-9 is provided at the other end of the first connection portion 11-8 on the opposite side in the X direction. In the second connection portion 11-9, the wiring layers 11-1, 11-3, 11-5, and 11-7 are connected to the row decoder 29. In embodiments, the second connection portion 11-9 and the wiring layers 11-1, 11-3, 11-5, and 11-7 may be collectively referred to as a wiring layer 11o.

A memory cell portion is provided between the first connection portion 11-8 and the second connection portion 11-9. In the memory cell portion, the wiring layers 11 adjacent to each other in the Y direction are spaced apart from each other by the slit SLT2 shown in FIG. 3. In addition, the wiring layers 11 between the blocks BLK adjacent to each other in the Y direction are spaced apart from each other by the slit SLT1 as in the case using the slit SLT2. As in FIG. 3, the memory cell portion includes memory pillars MP0 to MP15.

The select gate line SGS, the word lines WL0 to WL6, the dummy word lines WLDS0, WLDS1, WLDD0, and WLDD1 have the same configuration as the word line WL7 shown in FIG. 4.

Figure 5:
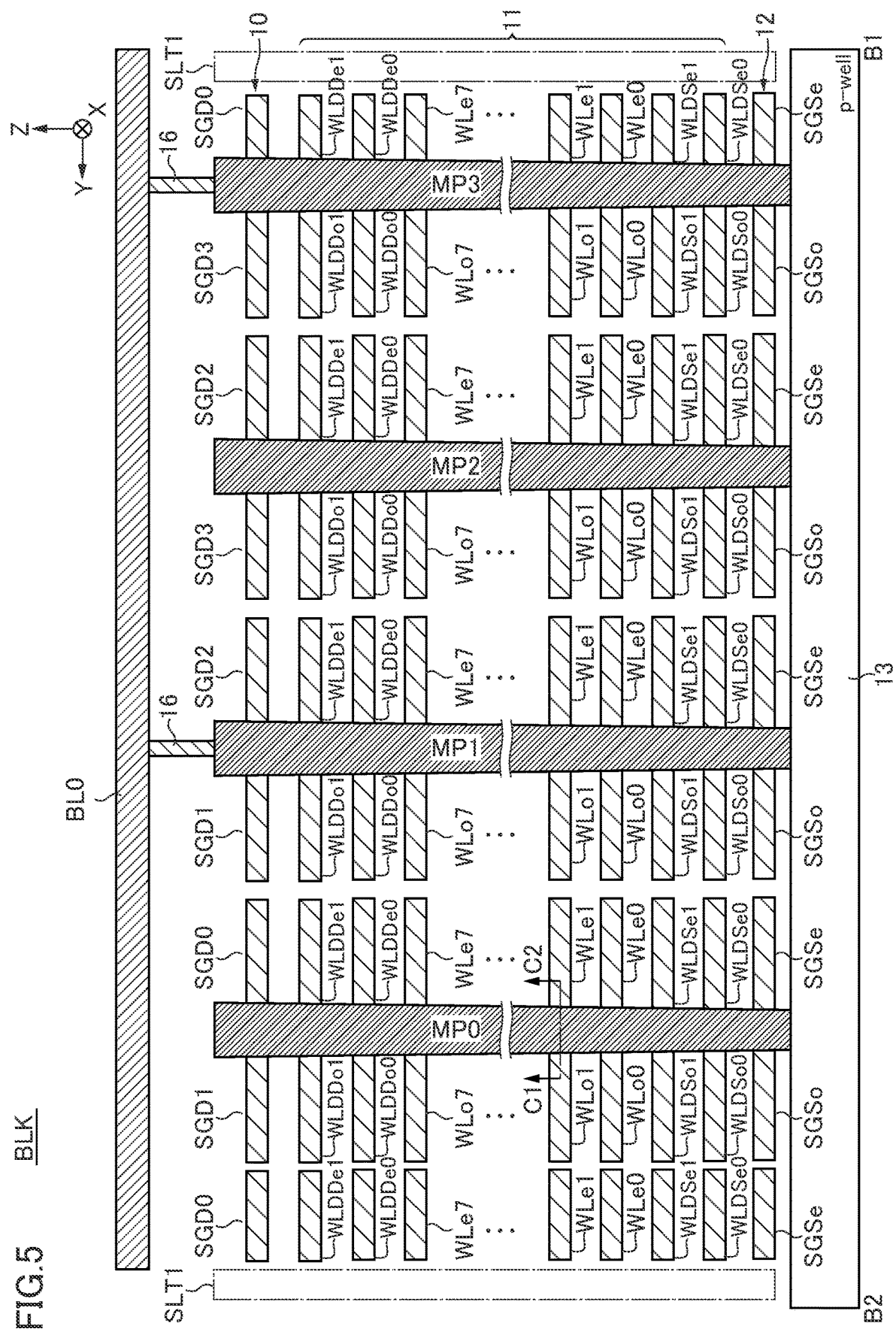
FIG. 5 is a cross-sectional view of a B1-B2 cut portion of the semiconductor memory device shown in FIGS. 3 and 4.

FIG. 5 is a cross-sectional view of a B1-B2 cut portion shown in FIG. 4. The cross-sectional view of the cut portion of the block BLK according to embodiments is not limited to the cross-sectional view of the cut portion shown in FIG. 5. In the description of FIG. 5, the description of the same or similar configuration as that of FIGS. 1 to 4 may be omitted.

As shown in FIG. 5, a wiring layer 12 is provided above a source line layer 13 along the Z direction. The source line layer 13 functions as the source line SL. In addition, the wiring layer 12 may be provided on a p-type well region in a semiconductor substrate (substrate) instead of the source line layer 13 shown in FIG. 5. In this case, the source line SL is electrically connected to the p-type well region in the semiconductor substrate. The wiring layer 12 functions as the select gate line SGS. A twelve-layer wiring layer 11 is stacked above the wiring layer 12 along the Z direction. The wiring layer 11 functions as the dummy word line WLDS, the word line WL, and the dummy word line WLDD. In addition, the wiring layer 11 corresponds to the dummy word line WLDS0, the dummy word line WLDS1, the word lines WL0 to WL7, the dummy word line WLDD0, and the dummy word line WLDD1 on a one-to-one basis. FIG. 4 is a diagram showing the planar layout of the wiring layer 11 that functions as the word line WL, and FIG. 3 is a diagram showing the planar layout of the wiring layer 10 that functions as the select gate line SGD. The planar layout of the wiring layer 12 that functions as the select gate line SGS is, for example, a layout in which the wiring layer 10 that functions as the select gate line SGD shown in FIG. 3 is replaced with the wiring layer 12 that functions as the select gate line SGS.

The wiring layer 12 functions as the even-numbered select gate line SGSe or the odd-numbered select gate line SGSo. The even-numbered select gate line SGSe and the odd-numbered select gate line SGSo are alternately arranged in the Y direction with the slit SLT2 interposed between the even-numbered select gate line SGSe and the odd-numbered select gate line SGSo. The memory pillar MP is provided between the even-numbered select gate line SGSe and the odd-numbered select gate line SGSo adjacent to each other in the Y direction.

The wiring layer 11 functions as the even-numbered dummy word line WLDSe, the odd-numbered dummy word line WLDSo, the even-numbered word line WLe, the odd-numbered word line WLo, the even-numbered dummy word line WLDDe, or the odd-numbered dummy word line WLDDo. The even-numbered dummy word line WLDSe and the odd-numbered dummy word line WLDSo are alternately arranged in the Y direction with the slit SLT2 interposed between the even-numbered dummy word line WLDSe and the odd-numbered dummy word line WLDSo. The memory pillar MP is provided between the even-numbered dummy word line WLDSe and the odd-numbered dummy word line WLDSo adjacent to each other in the Y direction. A memory cell, which will be described later, is provided between the memory pillar MP and the even-numbered dummy word line WLDSe and between the memory pillar MP and the odd-numbered dummy word line WLDSo. The even-numbered word line WLe and the odd-numbered word line WLo are alternately arranged in the Y direction with the slit SLT2 interposed between the even-numbered word line WLe and the odd-numbered word line WLo. The memory pillar MP is provided between the word lines WLe and WLo adjacent to each other in the Y direction. A memory cell, which will be described later, is provided between the memory pillar MP and the word line WLe and between the memory pillar MP and the word line WLo. The even-numbered dummy word line WLDDe and the odd-numbered dummy word line WLDDo are alternately arranged in the Y direction with the slit SLT2 interposed between the even-numbered dummy word line WLDDe and the odd-numbered dummy word line WLDDo. The memory pillar MP is provided between the even-numbered dummy word line WLDDe and the odd-numbered dummy word line WLDDo adjacent to each other in the Y direction. A memory cell, which will be described later, is provided between the memory pillar MP and the even-numbered dummy word line WLDDe and between the memory pillar MP and the odd-numbered dummy word line WLDDo.

The slit SLT1 is provided between the blocks BLK adjacent to each other in the Y direction. As described above, an insulating layer is provided in the slit SLT1. However, a contact plug or a groove-like structure formed by using a conductor may be provided in the slit SLT1 that is an insulator. When a contact plug or groove-like structure formed by using a conductor is provided in the slit SLT1, a voltage can be applied to the source line layer 13. In addition, the width of the slit SLT1 along the Y direction is larger than the width of the slit SLT2 along the Y direction.

As shown in FIGS. 3 and 5, the memory pillar MP is electrically connected to the bit line BL. For example, the memory pillar MP0 and the bit line BL1 are connected to each other through a contact plug 16. In addition, the memory pillar MP1 and the bit line BL0 are connected to each other through the contact plug 16, the memory pillar MP2 and the bit line BL1 are connected to each other through the contact plug 16, and the memory pillar MP3 and the bit line BL0 are connected to each other through the contact plug 16. Similarly, each of the memory pillars MP4 to MP7 is connected to the bit line BL2 or BL3, each of the memory pillars MP8 to MP11 is connected to the bit line BL4 or BL5, and each of the memory pillars MP12 to MP15 is connected to the bit line BL6 or BL7.

Figure 6:
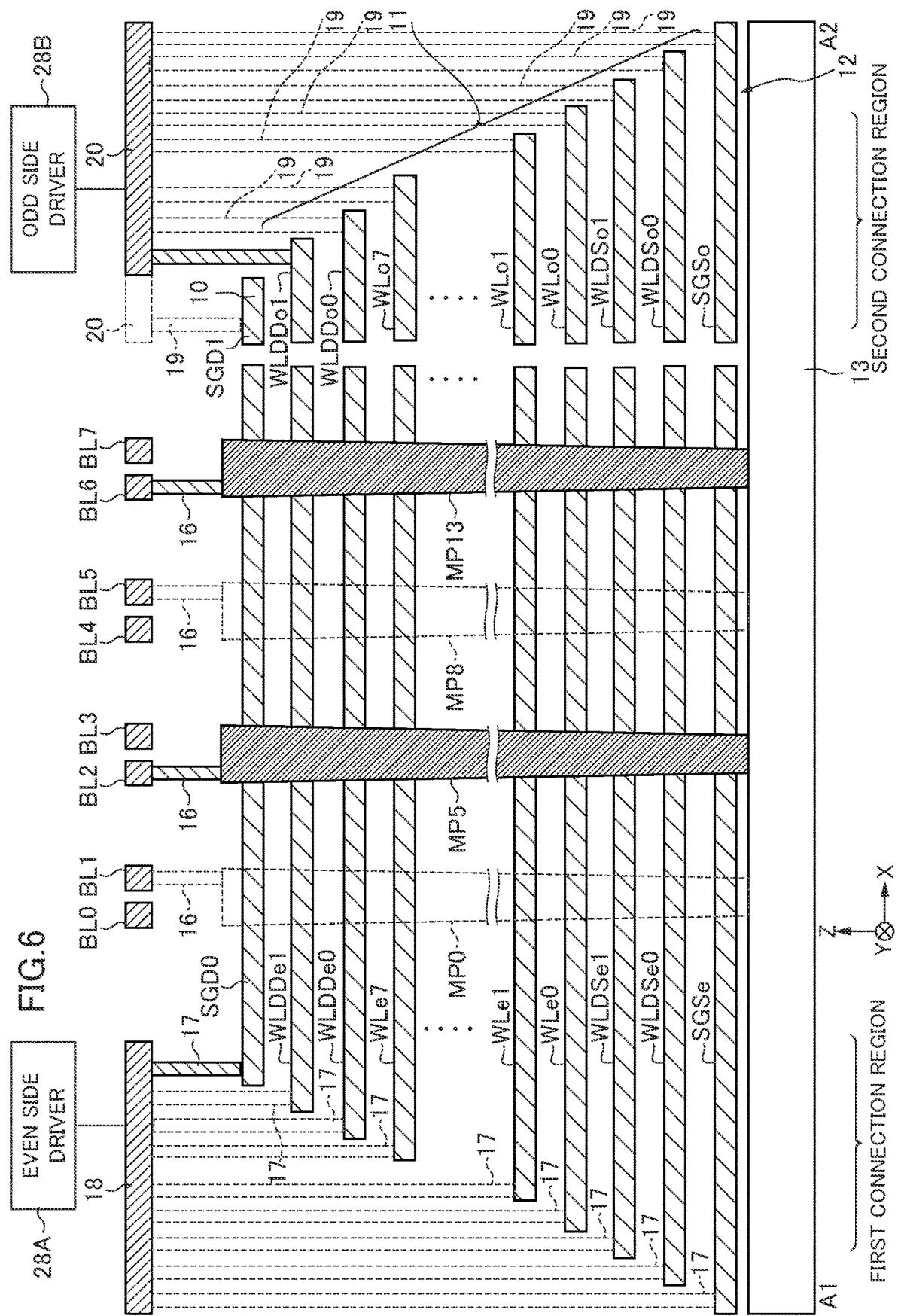
FIG. 6 is a cross-sectional view of an A1-A2 cut portion of the semiconductor memory device shown in FIGS. 3 and 4.

FIG. 6 is a cross-sectional view of an A1-A2 cut portion of the semiconductor memory device shown in FIG. 3. The cross-sectional view of the cut portion of the block BLK according to embodiments is not limited to the cross-sectional view of the cut portion shown in FIG. 6. In the description of FIG. 6, the description of the same or similar configuration as that of FIGS. 1 to 5 may be omitted. Since the stacked structure of the source line layer 13, the wiring layer 12, the wiring layer 11, and the wiring layer 10 and the configuration of the memory cell portion are the same as those described with reference to FIG. 5, the description herein will be omitted. In addition, in FIG. 6, a configuration present in the depth direction of the cross-sectional view of the A1-A2 cut portion is drawn by a dotted line.

As shown in FIG. 6, in the first connection region, the wiring layer 10, the wiring layer 11, and the wiring layer 12 are provided, for example, in a stepped shape and are drawn out from the source line layer 13. That is, when viewed on the XY plane, the upper surfaces of end portions of the wiring layer 10, the twelve-layer wiring layer 11, and the wiring layer 12 are exposed in the first connection region. A contact plug 17 is provided on the upper surface of the end portion of each of the wiring layer 10, the twelve-layer wiring layer 11, and the wiring layer 12 exposed in the first connection region. The contact plug 17 is connected to a metal wiring layer 18. For example, using the metal wiring layer 18, the wiring layer 10 that functions as the even-numbered select gate lines SGD0 and SGD2, the wiring layer 11 that functions as the even-numbered dummy word line WLDSe, the even-numbered dummy word line WLDDe, and the even-numbered word line WLe, and the wiring layer 12 that functions as the even-numbered select gate line SGSe are electrically connected to the even side driver 28A through the row decoder 29 (FIG. 1).

Similar to the first connection region, in the second connection region, the wiring layer 10, the wiring layer 11, and the wiring layer 12 are provided, for example, in a stepped shape and are drawn out from the source line layer 13. When viewed on the XY plane, the upper surfaces of end portions of the wiring layer 10, the twelve-layer wiring layer 11, and the wiring layer 12 are exposed in the second connection region. A contact plug 19 is provided on the upper surface of the end portion of each of the wiring layer 10, the twelve-layer wiring layer 11, and the wiring layer 12 exposed in the second connection region. The contact plug 19 is connected to a metal wiring layer 20. For example, using the metal wiring layer 20, the odd-numbered select gate lines SGD1 and SGD3, the wiring layer 11 that functions as the odd-numbered word line WLo, and the wiring layer 12 that functions as the odd-numbered select gate line SGSo are electrically connected to the odd side driver 28B through the row decoder 29 (FIG. 1).

The wiring layer 10 may be electrically connected to the row decoder 29 or the even side driver 28A and the odd side driver 28B through the second connection region instead of the first connection region, or may be electrically connected to the row decoder 29 or the even side driver 28A and the odd side driver 28B through both the first connection region and the second connection region.

Figure 7:
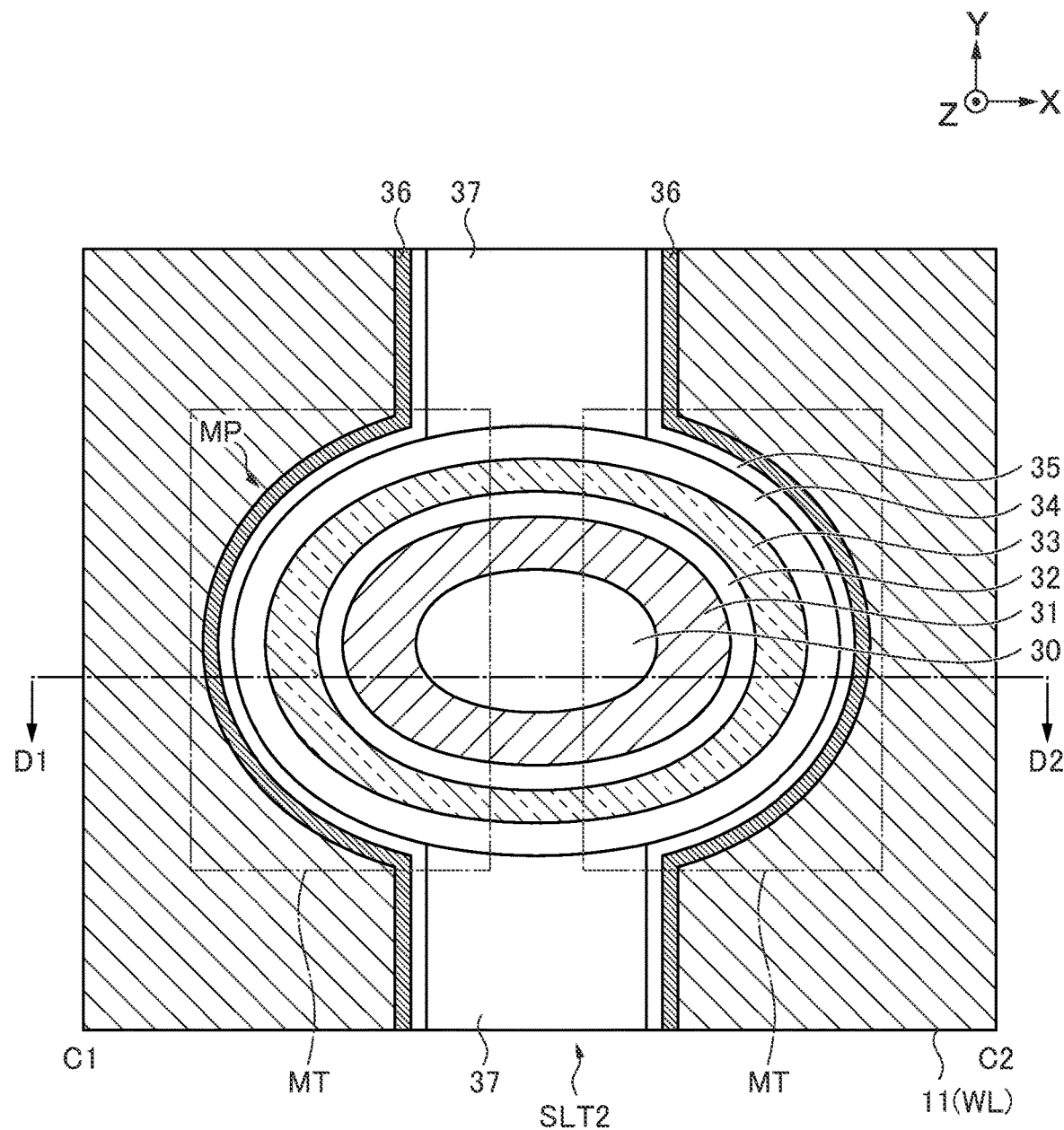
FIG. 7 is a cross-sectional view of a C1-C2 cut portion of a memory cell transistor shown in FIG. 5.
Figure 8:
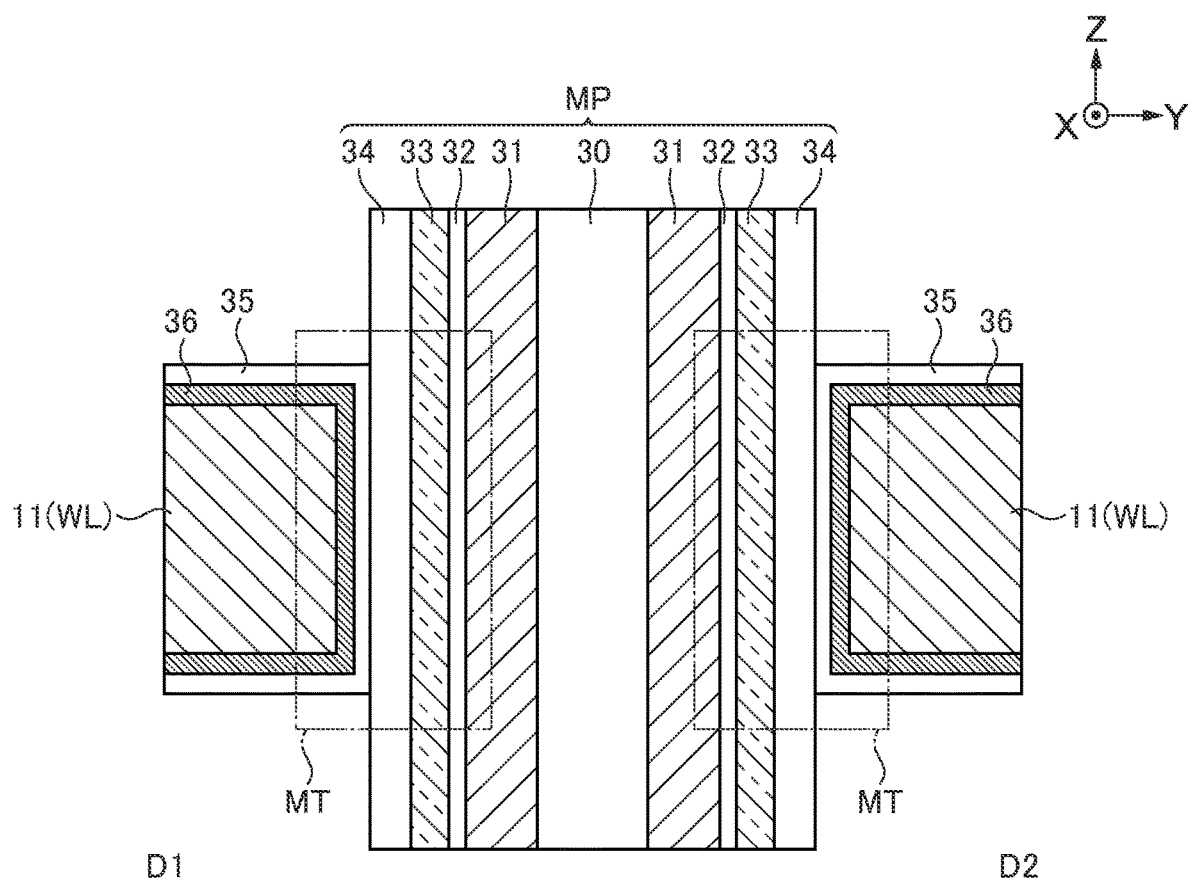
FIG. 8 is a cross-sectional view of a D1-D2 cut portion of the memory cell transistor shown in FIG. 7.

FIG. 7 is a cross-sectional view of a C1-C2 cut portion of the memory cell transistor according to embodiments, and FIG. 8 is a cross-sectional view of a D1-D2 cut portion of the memory cell transistor shown in FIG. 7. FIGS. 7 and 8 are cross-sectional views of cut portions, each of which shows a region including two memory cell transistors MT. In the first example, the charge storage layer included in the memory cell transistor MT is an insulating film. The first example of the memory cell transistor according to embodiments is not limited to the structures shown in FIGS. 7 and 8. In the description of FIGS. 7 and 8, the description of the same or similar configuration as that of FIGS. 1 to 6 may be omitted.

As shown in FIGS. 7 and 8, the memory pillar MP includes an insulating layer 30 (an example of an insulator), a semiconductor layer 31, and insulating layers 32 to 34, all of which are provided along the Z direction. The insulating layer 30 is formed by using, for example, a silicon oxide film. The semiconductor layer 31 is provided so as to surround the insulating layer 30, and functions as a region in which a channel of the memory cell transistor MT is formed. The semiconductor layer 31 (an example of the first channel and the second channel) is formed by using, for example, a polycrystalline silicon layer. The semiconductor layer 31 is not separated between the memory cell transistors MT in the same memory pillar MP, but is provided continuously. Therefore, the channels formed in the two memory cell transistors MT share a part of the memory pillar MP.

As described above, the semiconductor layer 31 is continuous between the two memory cell transistors MT facing each other. Therefore, the channels formed in the two memory cell transistors MT facing each other share a part of the memory pillar MP. Specifically, in FIGS. 7 and 8, in the left memory cell transistor MT and the right memory cell transistor MT facing each other, the channel formed in the first memory cell and the channel formed in the second memory cell share a part of the memory pillar MP. Here, the fact that the two channels share a part of the memory pillar MP means that the two channels are formed in the same memory pillar MP and the two channels partially overlap. In embodiments, in the above configuration, the two memory cell transistors MT may share the channel, or the two memory cell transistors MT may face each other.

The insulating layer 32 is provided so as to surround the semiconductor layer 31, and functions as a gate insulating film of the memory cell transistor MT. The insulating layer 32 is formed by using, for example, a stacked structure of a silicon oxide film and a silicon nitride film. The insulating layer 33 is provided so as to surround the semiconductor layer 31, and functions as a charge storage layer of the memory cell transistor MT. The insulating layer 33 is formed by using, for example, a silicon nitride film. The insulating layer 34 is provided so as to surround the insulating layer 33, and functions as a block insulating film of the memory cell transistor MT. The insulating layer 34 is formed by using, for example, a silicon oxide film. The insulating layer 37 is embedded in the slit SLT2 excluding the memory pillar MP portion. The insulating layer 37 is formed by using, for example, a silicon oxide film. The insulating layer 33 of the memory cell transistor MT on the left side and the insulating layer 33 of the memory cell transistor MT on the right side facing each other are connected by, for example, the insulating layer 33 including a silicon nitride film.

In the first example of embodiments, for example, an AlO layer 35 is provided around the memory pillar MP. For example, a barrier metal layer 36 is provided around the AlO layer 35. The barrier metal layer 36 is formed by using, for example, a TiN film. The wiring layer 11 that functions as the word line WL is provided around the barrier metal layer 36. The wiring layer 11 is formed by using, for example, a film formed of tungsten.

Therefore, one memory pillar MP includes two memory cell transistors MT and MT or two selection transistors ST1 and ST2 along the Y direction at a predetermined position on the Z axis.

1-6-2. Second Example

Figure 9:
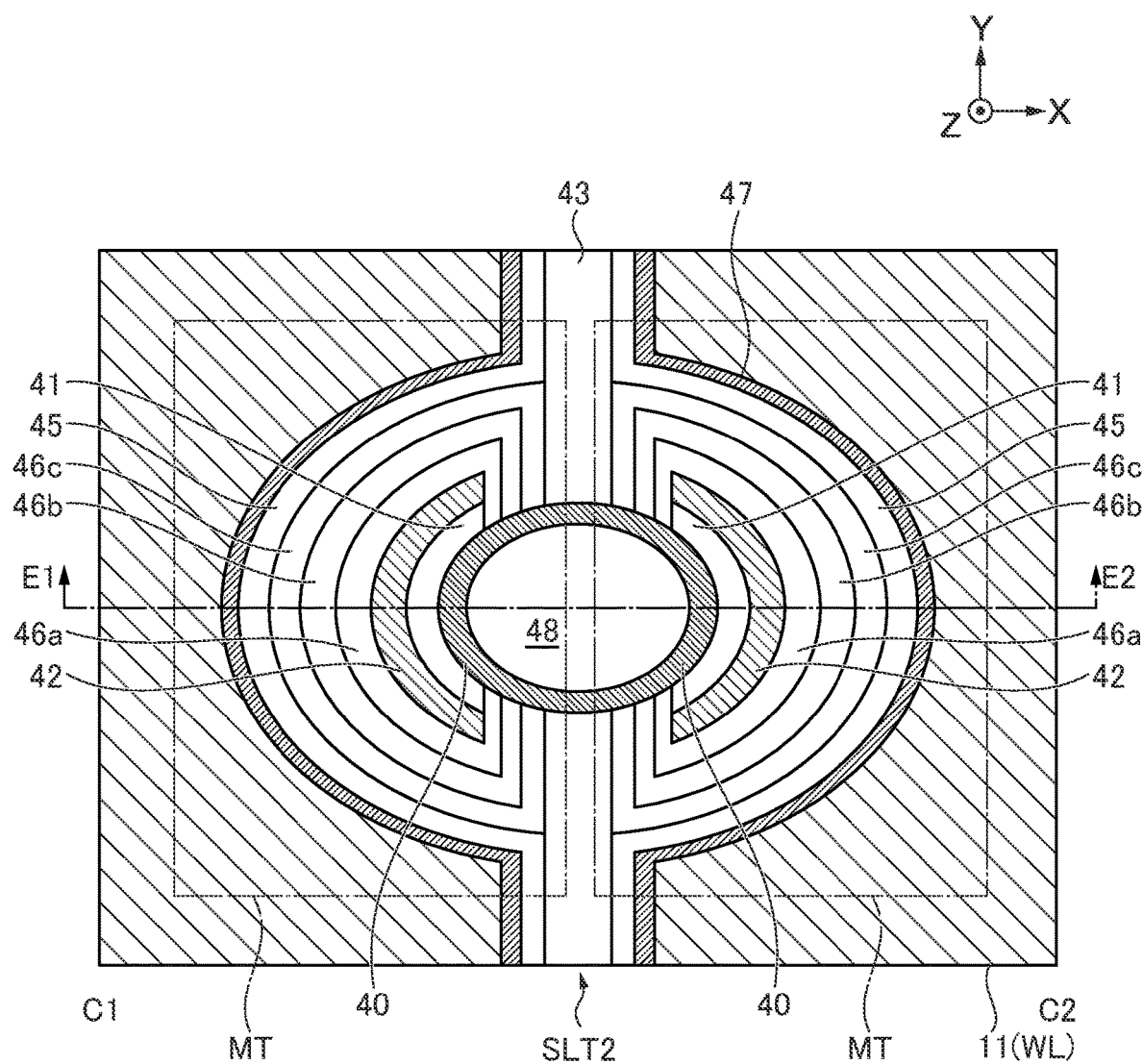
FIG. 9 is a cross-sectional view of a cut portion showing a modification example of the memory cell transistor shown in FIG. 7.
Figure 10:
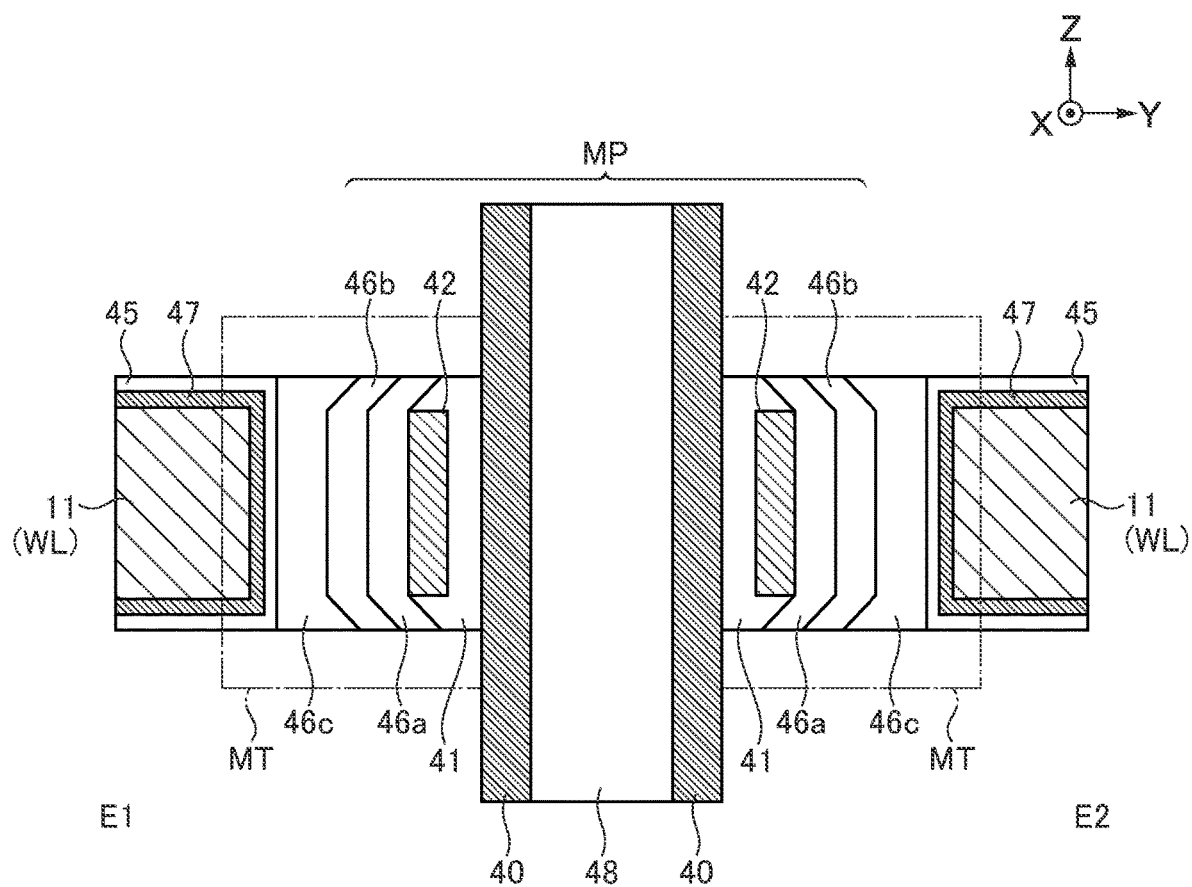
FIG. 10 is a cross-sectional view of an E1-E2 cut portion of the memory cell transistor shown in FIG. 9.
Figure 11:
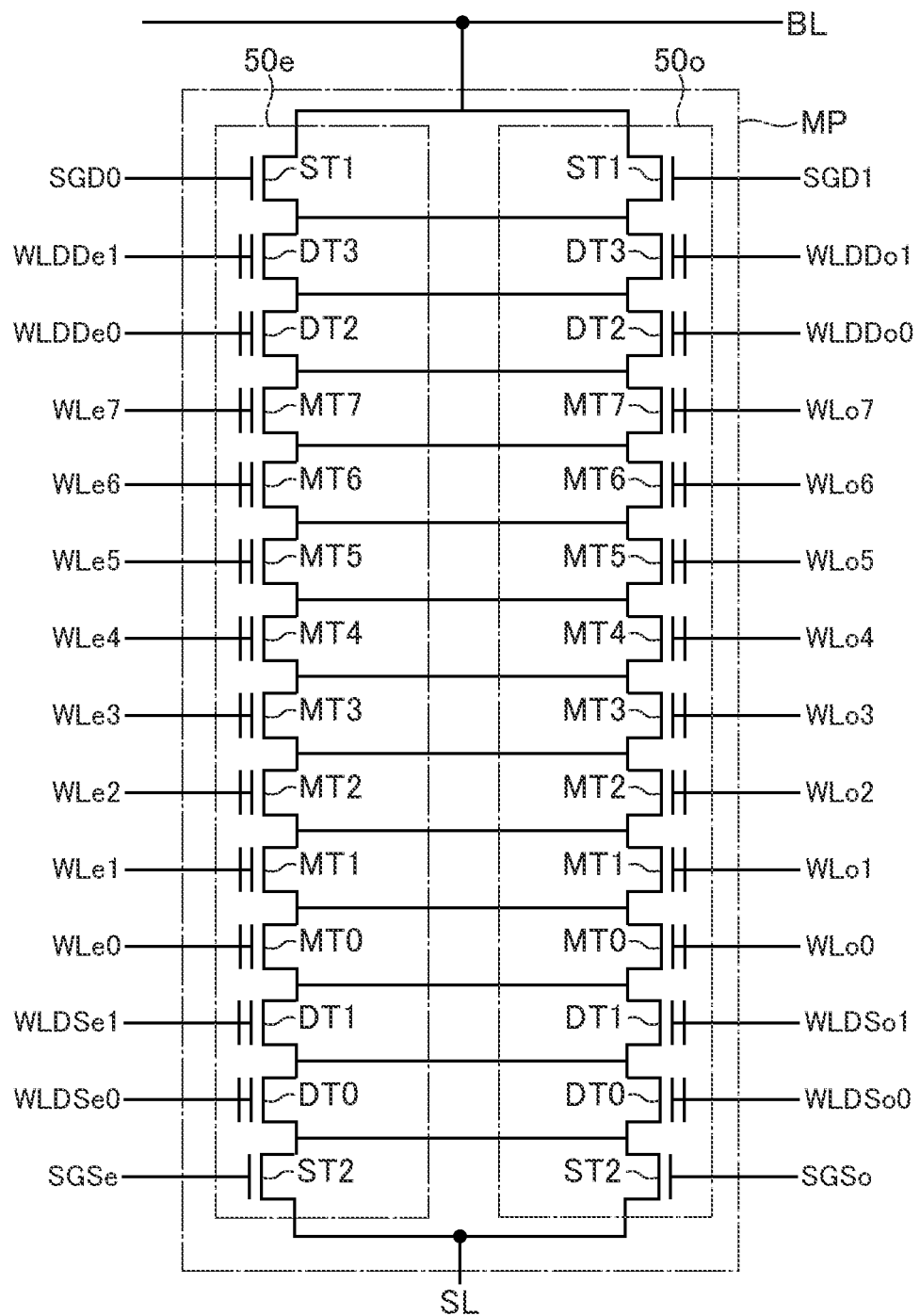
FIG. 11 is a diagram showing an equivalent circuit of a memory pillar (two NAND strings adjacent to each other) in the semiconductor memory device according to the first embodiment.

FIG. 9 is a diagram showing a modification example of the memory cell transistor shown in FIG. 7, and is a cross-sectional view of a C1-C2 cut portion of the memory cell transistor shown in FIG. 5. FIG. 10 is a cross-sectional view of an E1-E2 cut portion of the memory cell transistor shown in FIG. 9. FIGS. 9 and 10 are cross-sectional views of cut portions, each of which shows a region including two memory cell transistors MT. In the second example, the charge storage layer included in the memory cell transistor MT is a conductive film. The second example of the memory cell transistor according to embodiments is not limited to the structures shown in FIGS. 10 and 11. In the description of FIGS. 10 and 11, the description of the same or similar configuration as that of FIGS. 1 to 9 may be omitted.

As shown in FIGS. 10 and 11, the memory pillar MP includes an insulating layer 48 and an insulating layer 43, a semiconductor layer 40, an insulating layer 41, a conductive layer 42, and insulating layers 46a to 46c, all of which are provided along the Z direction. The insulating layer 48 is formed by using, for example, a silicon oxide film. The semiconductor layer 40 is provided so as to surround the insulating layer 48. The semiconductor layer 40 functions as a region in which a channel of the memory cell transistor MT is formed. The semiconductor layer 40 is formed by using, for example, a polycrystalline silicon layer. As in the first example of the memory pillar MP shown in FIG. 8, the semiconductor layer 40 is not separated between the memory cell transistors MT in the same memory pillar MP, but is provided continuously.

The insulating layer 41 is provided around the semiconductor layer 40 and functions as a gate insulating film of each memory cell transistor MT. The insulating layer 41 is separated into two regions within the XY plane shown in FIG. 10. Each of the insulating layers 41 obtained as a result of separation into two regions functions as a gate insulating film of each of the two memory cell transistors MT in the same memory pillar MP. The insulating layer 41 is formed by using, for example, a stacked structure of a silicon oxide film and a silicon nitride film.

The conductive layer 42 is provided around the insulating layer 41 and is separated into two regions along the Y direction by the insulating layer 43. Each of the conductive layers 42 obtained as a result of separation into two regions functions as a charge storage layer of each of the two memory cell transistors MT. The conductive layer 42 is formed by using, for example, a polycrystalline silicon layer.

The insulating layer 43 is formed by using, for example, a silicon oxide film. Around the conductive layer 42, the insulating layers 46a, 46b, and 46c are provided sequentially from the side close to the conductive layer 42. The insulating layers 46a and 46c are formed by using, for example, a silicon oxide film, and the insulating layer 46b is formed by using, for example, a silicon nitride film. Each of the insulating layers 46a, 46b, and 46c functions as a block insulating film of the memory cell transistor MT. Each of the insulating layers 46a, 46b, and 46c is separated into two regions along the Y direction. The insulating layer 43 is provided between the insulating layers 46c obtained as a result of separation into two regions. In addition, the insulating layer 43 is embedded in the slit SLT2. The insulating layer 43 is formed by using, for example, a silicon oxide film.

In the second example of embodiments, for example, an AlO layer 45 is provided around the memory pillar MP. For example, a barrier metal layer 47 is provided around the AlO layer 45. The barrier metal layer 47 is formed by using, for example, a TiN film. The wiring layer 11 that functions as the word line WL is provided around the barrier metal layer 47. As in the first example of the memory pillar MP according to embodiments, the wiring layer 11 in the second example of the memory pillar MP according to embodiments is formed by using, for example, a film formed of tungsten.

Also in the second example of the memory pillar MP according to embodiments, as in the first example of the memory pillar MP, one memory pillar MP includes two memory cell transistors MT and MT or two selection transistors ST1 and ST2 along the Y direction at a predetermined position on the Z axis. In addition, although not shown, an insulating layer is provided between the memory cell transistors adjacent to each other in the Z direction. By the insulating layer, the insulating layer 43, and the insulating layer 46, the conductive layer 42 is insulated for each individual memory cell transistor.

FIG. 11 is an equivalent circuit diagram of a memory pillar (two NAND strings adjacent to each other) in the semiconductor memory device 1 according to embodiments. The equivalent circuit diagram of the memory pillar according to embodiments is not limited to the equivalent circuit diagram shown in FIG. 11. In the description of FIG. 11, the description of the same or similar configuration as that of FIGS. 1 to 10 may be omitted.

As shown in FIG. 11, two NAND strings 50e and 50o are formed in one memory pillar MP. Each of the NAND strings 50e and 50o has the selection transistor ST1, the dummy transistors DT0 and DT1, the memory cell transistors MT0 to MT7, the dummy transistors DT2 and DT3, and the selection transistor ST2 electrically connected in series to each other. The NAND string 50e and the NAND string 50o are provided so as to face each other. Therefore, the selection transistor ST1, the dummy transistors DT0 and DT1, the memory cell transistors MT0 to MT7, the dummy transistors DT2 and DT3, and the selection transistor ST2 included in the NAND string 50e and the selection transistor ST1, the dummy transistors DT0 and DT1, the memory cell transistors MT0 to MT7, the dummy transistors DT2 and DT3, and the selection transistor ST2 included in the NAND string 50o are provided so as to face each other on a one-to-one basis. Specifically, the selection transistors ST1 included in the NAND string 50e and the selection transistors ST1 included in the NAND string 50o are provided so as to face each other, the dummy transistors DT0 and DT1 included in the NAND string 50e and the dummy transistors DT0 and DT1 included in the NAND string 50o are provided so as to face each other on a one-to-one basis, the memory cell transistors MT0 to MT7 included in the NAND string 50e and the memory cell transistors MT0 to MT7 included in the NAND string 50o are provided so as to face each other on a one-to-one basis, the dummy transistors DT2 and DT3 included in the NAND string 50e and the dummy transistors DT2 and DT3 included in the NAND string 50o are provided so as to face each other on a one-to-one basis, and the selection transistor ST2 included in the NAND string 50e and the selection transistor ST2 included in the NAND string 50o are provided so as to face each other.

In the following description, an example including two memory pillars MP, that is, a first memory pillar MP (for example, MP4 in FIG. 4) and a second memory pillar MP (for example, MP0 in FIG. 4) adjacent to the first memory pillar MP will be mainly described.

The selection transistor ST1 of the NAND string 50*e* provided in each of the first memory pillar MP and the second memory pillar MP is connected to, for example, the common select gate line SGD0. The selection transistor ST1 of the NAND string 50*o* provided in each of the first memory pillar MP and the second memory pillar MP is connected to, for example, the common select gate line SGD1. The dummy transistors DT2 and DT3 of the NAND string 50*e* provided in each of the first memory pillar MP and the second memory pillar MP are connected to the common dummy word lines WLDDe0 and WLDDe1, respectively. The dummy transistors DT2 and DT3 of the NAND string 50*o* provided in each of the first memory pillar MP and the second memory pillar MP are connected to the common dummy word lines WLDDo0 and WLDDo1, respectively. The memory cell transistors MT0 to MT7 of the NAND string 50*e* provided in each of the first memory pillar MP and the second memory pillar MP are connected to the common word lines WLe0 to WLe7, respectively. The memory cell transistors MT0 to MT7 of the NAND string 50*o* provided in each of the first memory pillar MP and the second memory pillar MP are connected to the common word lines WLo0 to WLo7, respectively. The dummy transistors DT0 and DT1 of the NAND string 50*e* provided in each of the first memory pillar MP and the second memory pillar MP are connected to the common dummy word lines WLDSe0 and WLDSe1, respectively. The dummy transistors DT0 and DT1 of the NAND string 50*o* provided in each of the first memory pillar MP and the second memory pillar MP are connected to the common dummy word lines WLDSo0 and WLDSo1, respectively. The selection transistor ST2 of the NAND string 50*e* provided in each of the first memory pillar MP and the second memory pillar MP is connected to, for example, the common even-numbered select gate line SGSe. The selection transistor ST2 of the NAND string 50*o* provided in each of the first memory pillar MP and the second memory pillar MP is connected to, for example, the common odd-numbered select gate line SGSo.

As described above, the selection transistor ST1, the dummy transistors DT2 and DT3, the memory cell transistors MT0 to MT7, the dummy transistors DT0 and DT1, and the selection transistor ST2 included in the NAND string 50*e* and the selection transistor ST1, the dummy transistors DT2 and DT3, the memory cell transistors MT0 to MT7, the dummy transistors DT0 and DT1, and the selection transistor ST2 included in the NAND string 50*o* correspond to each other. In the two transistors facing each other, the sources are electrically connected to each other and the drains are electrically connected to each other. Specifically, in the NAND strings 50*e* and 50*o*, the sources and drains of the selection transistors ST1 facing each other are electrically connected to each other, the sources and drains of the dummy transistors DT3 facing each other are electrically connected to each other, the sources and drains of the dummy transistors DT2 facing each other are electrically connected to each other, the sources and drains of the memory cell transistors MT0 to MT7 facing each other are electrically connected to each other, the sources and drains of the dummy transistors DT1 facing each other are electrically connected to each other, the sources and drains of the dummy transistors DT0 facing each other are electrically connected to each other, and the sources and drains of the selection transistors ST2 facing each other are electrically connected to each other. This is because the channels formed in the transistors facing each other share a part of the memory pillar MP.

The two NAND strings 50*e* and 50*o* in the same memory pillar MP are connected to the same bit line BL and the same source line SL.

How the select gate line SGD is selected will be described with reference to FIGS. 3 and 4. When one of the select gate lines SGD0 to SGD3 is selected, a voltage for turning on the selection transistor ST1 is supplied to one of the wiring layers 10-0 to 10-3 corresponding to the select gate lines. For example, when the wiring layer 10-1 is selected, eight selection transistors ST1 provided in the memory pillars MP0, MP1, MP4, MP5, MP8, MP9, MP12, and MP13 are turned on. As a result, eight memory cell transistors MT belonging to the above memory pillars are selected. That is, one page is formed by the above eight memory cell transistors MT. Since the operation when a wiring layer other than the wiring layer 10-1 is selected is the same as the above, the description will be omitted.

In embodiments, for example, the TLC method is applied as a writing method of the memory cell transistor MT. A plurality of memory cell transistors MT to which the TLC method is applied form eight threshold distributions (write levels). The eight threshold distributions are referred to as, for example, "Er" level, "A" level, "B" level, "C" level, "D" level, "E" level, "F" level, and "G" level in order from the lowest threshold voltage. Different 3-bit data is assigned to "Er" level, "A" level, "B" level, "C" level, "D" level, "E" level, "F" level, and "G" level.

The semiconductor memory device 1 according to embodiments repeatedly executes a program loop in the write operation. The program loop includes, for example, a program operation and a verify operation. The program operation is an operation of increasing the threshold voltage of the selected memory cell transistor MT by injecting electrons into the charge storage layer in the selected memory cell transistor MT. Alternatively, the program operation is an operation of maintaining the threshold voltage of the selected memory cell transistor MT by prohibiting the injection of electrons into the charge storage layer. The verify operation is an operation of checking whether or not the threshold voltage of the selected memory cell transistor MT has reached the target level by a read operation using the verify voltage subsequent to the program operation. The selected memory cell transistor MT whose threshold voltage has reached the target level is then write-protected.

In the semiconductor memory device 1 according to embodiments, the threshold voltage of the selected memory cell transistor MT is increased to the target level by repeatedly executing the program loop including the program operation and the verify operation described above.

The electrons stored in the charge storage layer may be stored in an unstable state. Therefore, from the time when the above-described program operation is completed, the electrons stored in the charge storage layer of the memory cell transistor MT may escape from the charge storage layer with the passage of time. When the electrons escape from the charge storage layer, the threshold voltage of the memory cell transistor MT decreases. Therefore, in the read operation executed after the write operation is completed, in order to cope with such a decrease in the threshold voltage of the memory cell transistor that may occur with the passage of time, the read operation is performed using a read voltage lower than the verify voltage. The read operation may include a verify operation.

Figure 13:
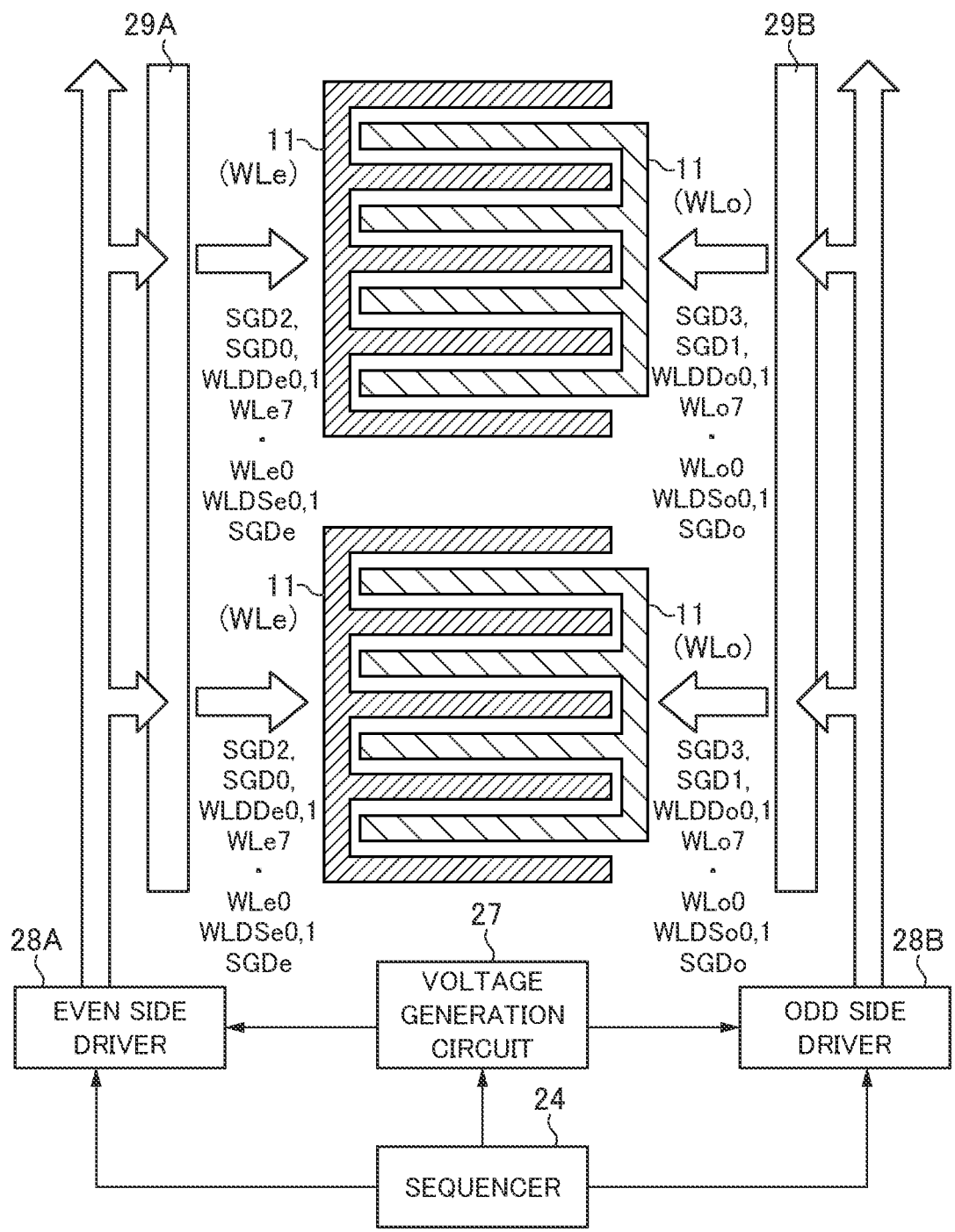
FIG. 13 is a diagram for explaining the electrical connection of a voltage generation circuit, a driver set, a select gate line, or a word line according to the first embodiment.

FIGS. 12 and 13 are diagrams for explaining the electrical connection of the sequencer 24, the voltage generation circuit 27, the driver set 28, the row decoder 29, the select gate line SGD or the word line WL according to embodiments. The electrical connection of the sequencer 24, the voltage generation circuit 27, the driver set 28, the row decoder 29, the select gate line SGD or the word line WL according to embodiments is not limited to the electrical connections shown in FIGS. 12 and 13. In the description of FIGS. 12 and 13, the description of the same or similar configuration as that of FIGS. 1 to 11 may be omitted. A circuit including the sequencer 24, the voltage generation circuit 27, the driver set 28, and the row decoder 29 is an example of a control circuit.

As shown in FIG. 12, the wiring layer 11 that functions as the even-numbered word line WLe may be connected to the even side driver 28A, and the wiring layer 11 that functions as the odd-numbered word line WLo may be electrically connected to the odd side driver 28B. As described above, the even side driver 28A and the odd side driver 28B are included in the driver set 28. The driver set 28 is electrically connected to the voltage generation circuit 27. As shown in FIGS. 12 and 13, the even side driver 28A and the odd side driver 28B may generate various voltages using the voltage supplied from the voltage generation circuit 27. Then, the even side driver 28A may supply the generated voltage to the even-numbered word line WLe of each block BLK through the row decoder 29A. In addition, the odd side driver 28B may supply the generated voltage to the odd-numbered word line WLo of each block BLK through the row decoder 29B. The row decoder 29A and the row decoder 29B are included in the row decoder 29.

As shown in FIG. 13 and as described above, the sequencer 24 can execute various operations, such as a write operation and a read operation, by controlling the driver set 28 and the like.

Figure 14:
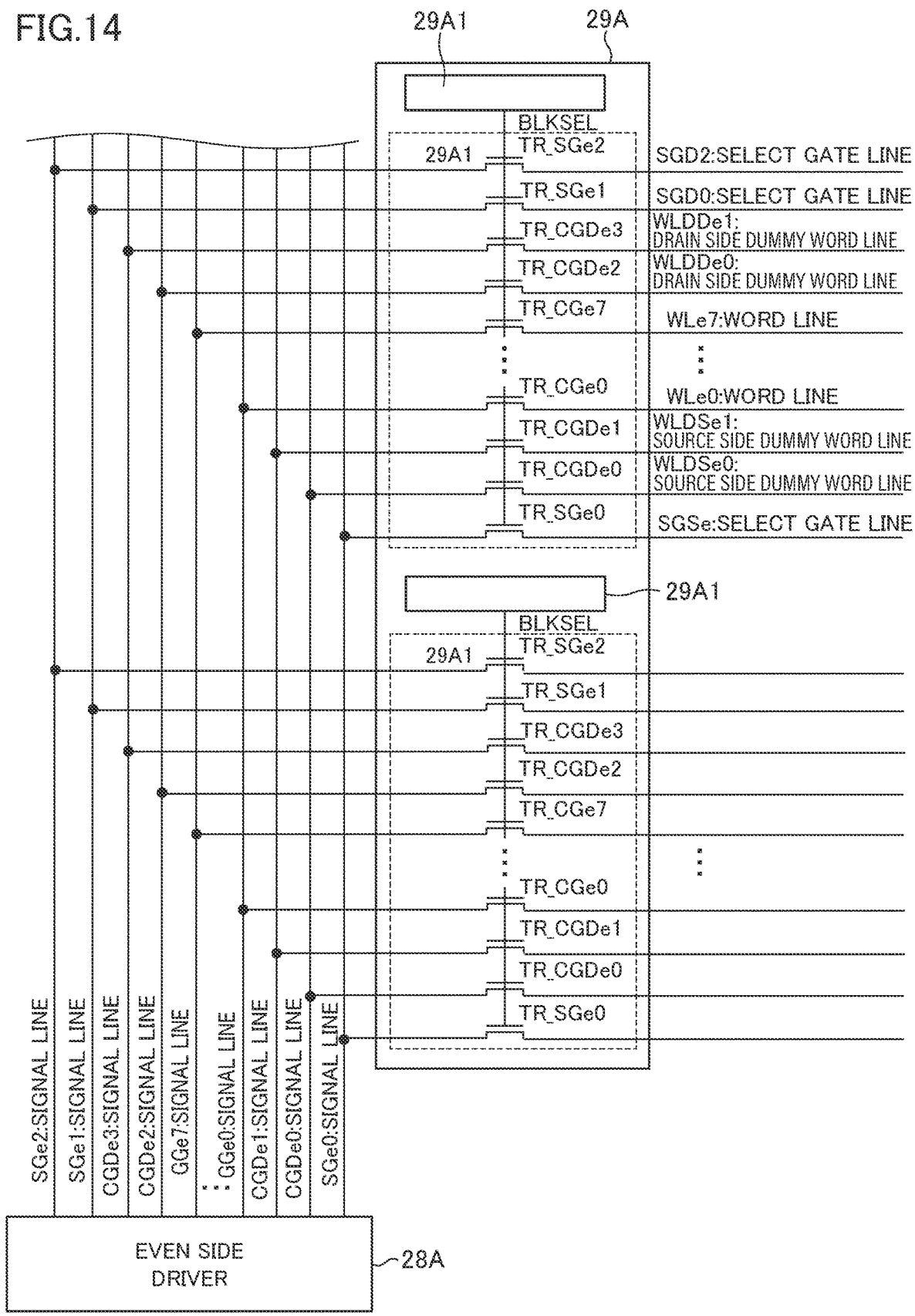
FIG. 14 is a schematic diagram for explaining the electrical connection between an even side driver and a row decoder according to the first embodiment.

FIG. 14 is a schematic diagram for explaining the electrical connection between the even side driver 28A and the row decoder 29A according to embodiments.

A signal line SGe0, a signal line SGe1, a signal line SGe2, a signal line CGDe0, a signal line CGDe1, a signal line CGDe2, a signal line CGDe3, and signal lines CGe0, . . . , CGe7 as signal lines CGe are connected to the even side driver 28A. In addition, as for the signal lines CGe, for example, there are as many signal lines CGe as the number of even-numbered word lines WL arranged in the Z direction in the block BLK.

The signal line SGe0 is connected to the even-numbered select gate line SGSe in each block BLK through a transistor TR_SGe0. The transistor TR_SGe0 functions as a switch for turning on/off the signal from the signal line SGe0 using a block decoder 29A1.

The signal lines CGDe0 and CGDe1 are connected to the even-numbered dummy word lines WLDSe0 and WLDSe1 in each block BLK through transistors TR_CGDe0 and TR_CGDe1, respectively. The transistors TR_CGDe0 and TR_CGDe1 function as switches for turning on/off the signals from the signal lines CGDe0 and CGDe1 using the block decoder 29A1.

The signal lines CGe0, . . . , CGe7 are connected to the even-numbered word lines WLe0, . . . , WLe7 in each block BLK through transistors TR_CGe0, . . . , TR_CGe7, respectively. The transistors TR_CGe0, . . . , TR_CGe7 function as switches for turning on/off the signals from the signal lines CGe0, . . . , CGe7 using the block decoder 29A1.

The signal lines CGDe2 and CGDe3 are connected to the even-numbered dummy word lines WLDDe0 and WLDDe1 in each block BLK through transistors TR_CGDe2 and TR_CGDe3, respectively. The transistors TR_CGDe2 and TR_CGDe3 function as switches for turning on/off the signals from the signal lines CGDe2 and CGDe3 using the block decoder 29A1.

The signal line SGe1 is connected to the select gate line SGD0 in each block BLK through a transistor TR_SGe1. The transistor TR_SGe1 functions as a switch for turning on/off the signal from the signal line SGe1 using the block decoder 29A1.

The signal line SGe2 is connected to the select gate line SGD2 in each block BLK through a transistor TR_SGe2. The transistor TR_SGe2 functions as a switch for turning on/off the signal from the signal line SGe2 using the block decoder 29A1.

Figure 15:
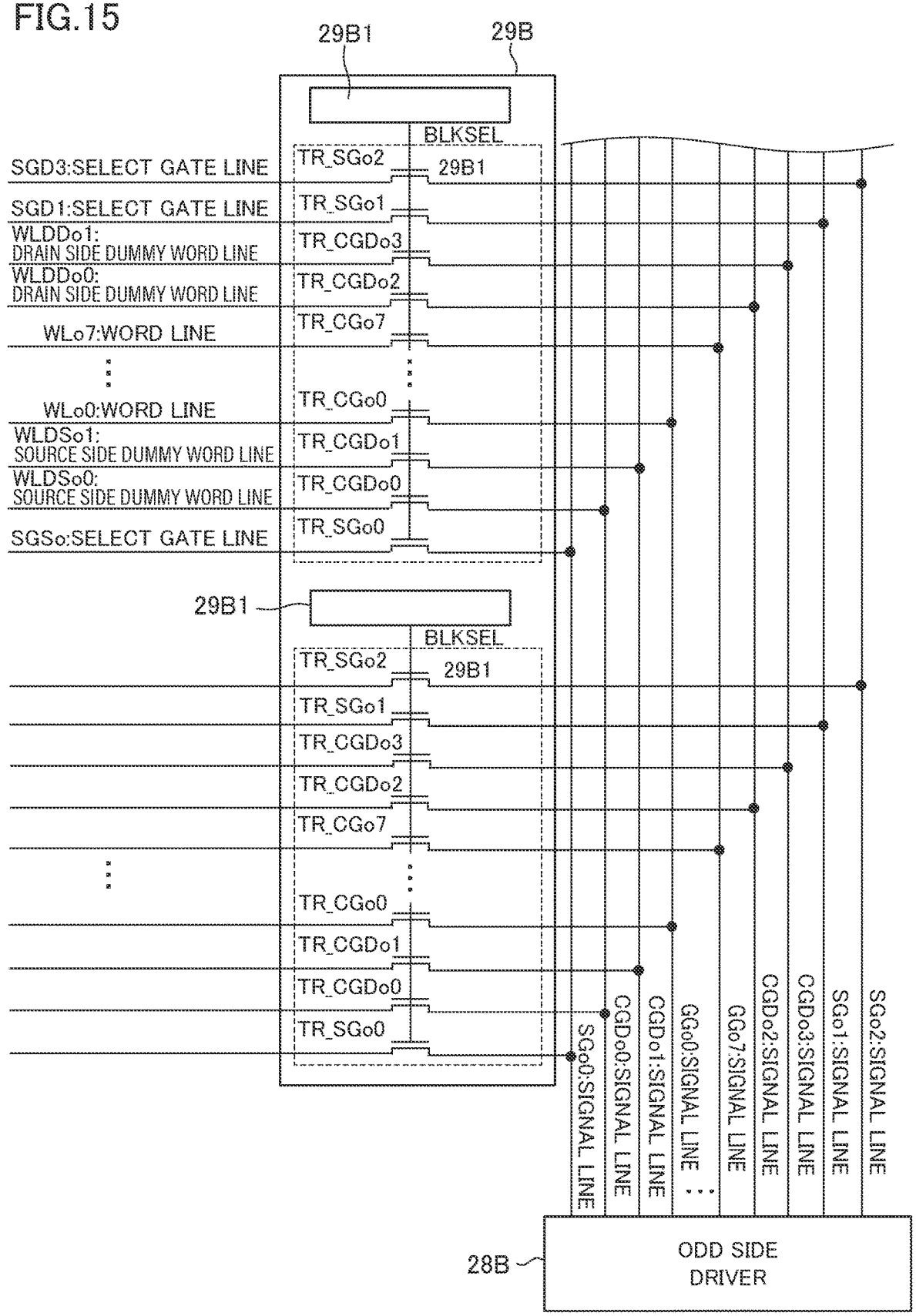
FIG. 15 is a schematic diagram for explaining the electrical connection between an odd side driver and a row decoder according to the first embodiment.

FIG. 15 is a schematic diagram for explaining the electrical connection between the odd side driver 28B and the row decoder 29B according to embodiments.

A signal line SGo0, a signal line SGo1, a signal line SGo2, a signal line CGDo0, a signal line CGDo1, a signal line CGDo2, a signal line CGDo3, and signal lines CGo0, . . . , CGo7 as signal lines CGo are connected to the odd side driver 28B. In addition, as for the signal line CGo, for example, as many signal lines CGo as the number of odd-numbered word lines WL arranged in the Z direction in the block BLK are connected.

The signal line SGo0 is connected to the odd-numbered select gate line SGSo in each block BLK through a transistor TR_SGo0. The transistor TR_SGo0 functions as a switch for turning on/off the signal from the signal line SGo0 using a block decoder 29B1.

The signal lines CGDo0 and CGDo1 are connected to the odd-numbered dummy word lines WLDSo0 and WLDSo1 in each block BLK through transistors TR_CGDo0 and TR_CGDo1, respectively. The transistors TR_CGDo0 and TR_CGDo1 function as switches for turning on/off the signals from the signal lines CGDo0 and CGDo1 using the block decoder 29B1.

The signal lines CGo0, . . . , CGo7 are connected to the odd-numbered word lines WLo0, . . . , WLo7 in each block BLK through transistors TR_CGo0, . . . , TR_CGo7, respectively. The transistors TR_CGo0, . . . , TR_CGo7 functions as switches for turning on/off the signals from the signal lines CGo0, . . . , CGo7 using the block decoder 29B1.

The signal lines CGDo2 and CGDo3 are connected to the odd-numbered dummy word lines WLDDo0 and WLDDo1 in each block BLK through transistors TR_CGDo2 and TR_CGDo3, respectively. The transistors TR_CGDo2 and TR_CGDo3 function as switches for turning on/off the signals from the signal lines CGDo2 and CGDo3 using the block decoder 29B1.

The signal line SGo1 is connected to the select gate line SGD1 in each block BLK through a transistor TR_SGo1. The transistor TR_SGo1 functions as a switch for turning on/off the signal from the signal line SGo1 using the block decoder 29B1.

The signal line SGo2 is connected to the select gate line SGD3 in each block BLK through a transistor TR_SGo2. The transistor TR_SGo2 functions as a switch for turning on/off the signal from the signal line SGo2 using the block decoder 29B1.

Figure 16:
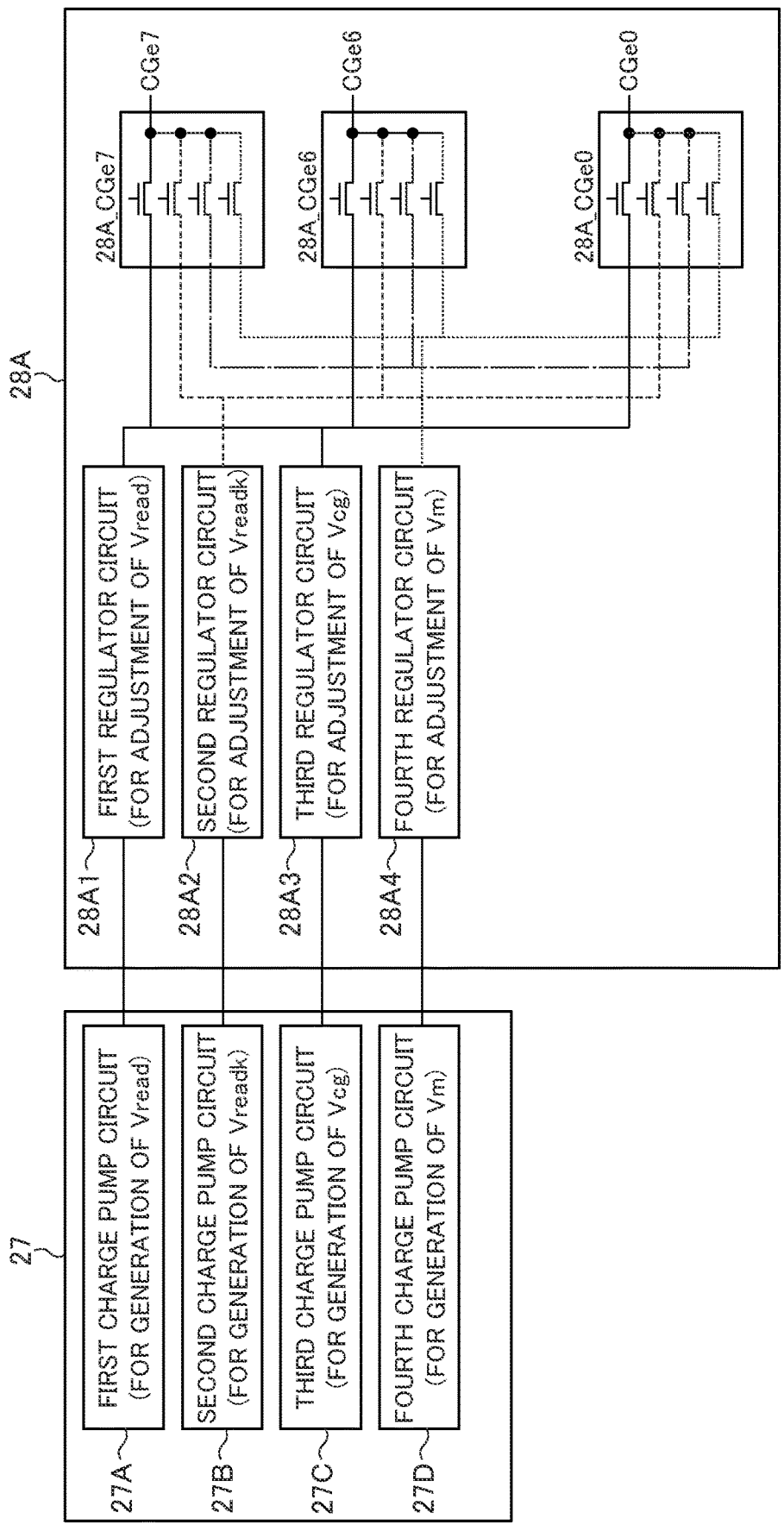
FIG. 16 is a schematic diagram for explaining the electrical connection between a voltage generation circuit and an even side driver according to the first embodiment.

FIG. 16 is a schematic diagram for explaining the electrical connection between the voltage generation circuit 27 and the even side driver 28A according to embodiments.

Voltages Vpgm, Vpass, VSGD1, and VSGD2, which will be described later, are generated by, for example, a first charge pump circuit 27A, a second charge pump circuit 27B, a third charge pump circuit 27C, and a fourth charge pump circuit 27D in the voltage generation circuit 27, respectively. Then, the voltages Vpgm, Vpass, VSGD1, and VSGD2 are held by a first regulator circuit 28A1, a second regulator circuit 28A2, a third regulator circuit 28A3, and a fourth regulator circuit 28A4 in the even side driver 28A, respectively. Then, the voltages Vpgm, Vpass, VSGD1, and VSGD2 are appropriately added and supplied to the signal lines CGe0, . . . , CGe7.

Figure 17:
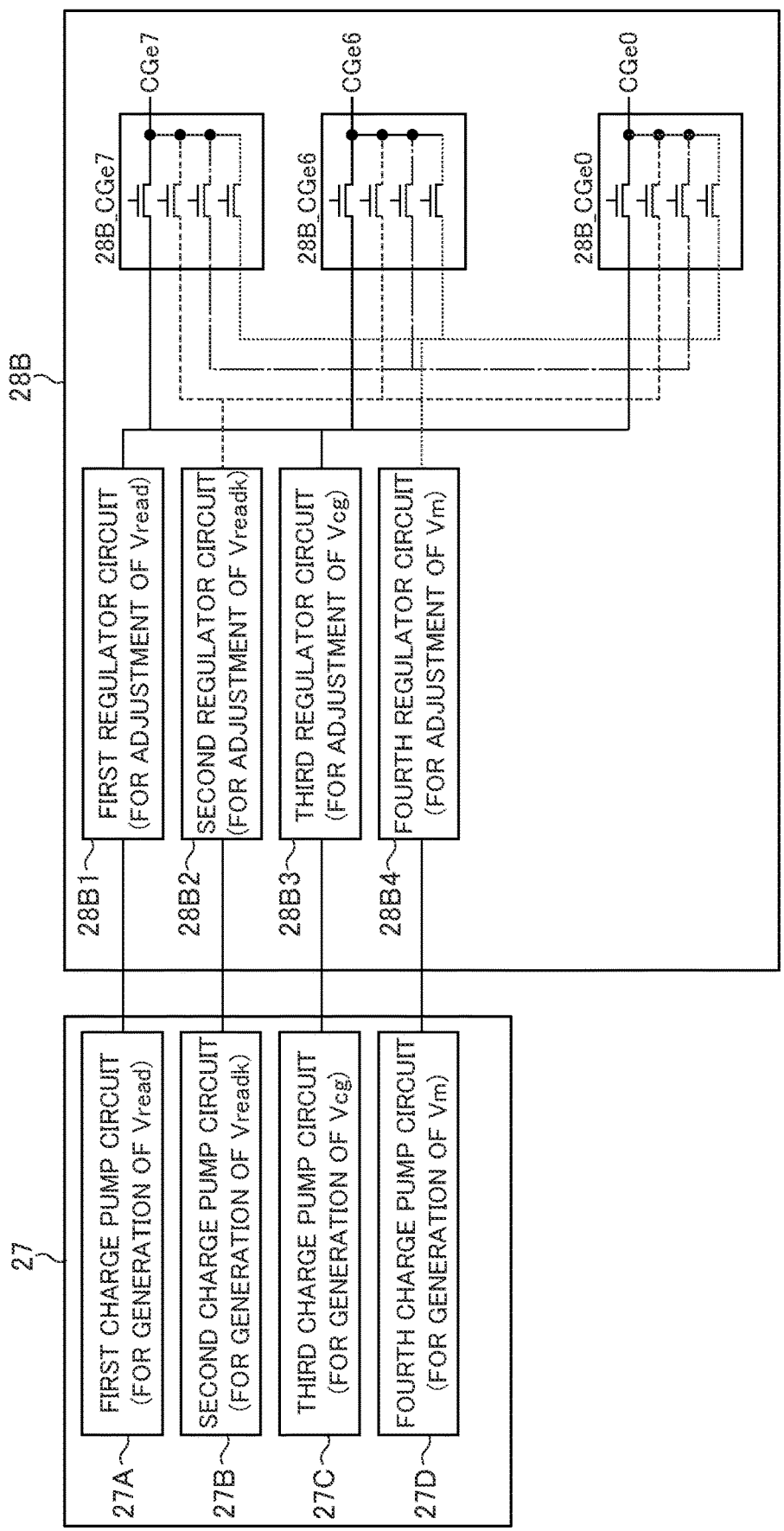
FIG. 17 is a schematic diagram for explaining the electrical connection between a voltage generation circuit and an odd side driver according to the first embodiment.

FIG. 17 is a schematic diagram for explaining the electrical connection between the voltage generation circuit 27 and the odd side driver 28B according to embodiments.

The voltages Vpgm, Vpass, VSGD1, and VSGD2 are held by a first regulator circuit 28B1, a second regulator circuit 28B2, a third regulator circuit 28B3, and a fourth regulator circuit 28B4 in the odd side driver 28B, respectively. Then, the voltages Vpgm, Vpass, VSGD1, and VSGD2 are appropriately added and supplied to the signal lines CGo0, . . . , CGo7.

Figure 18:
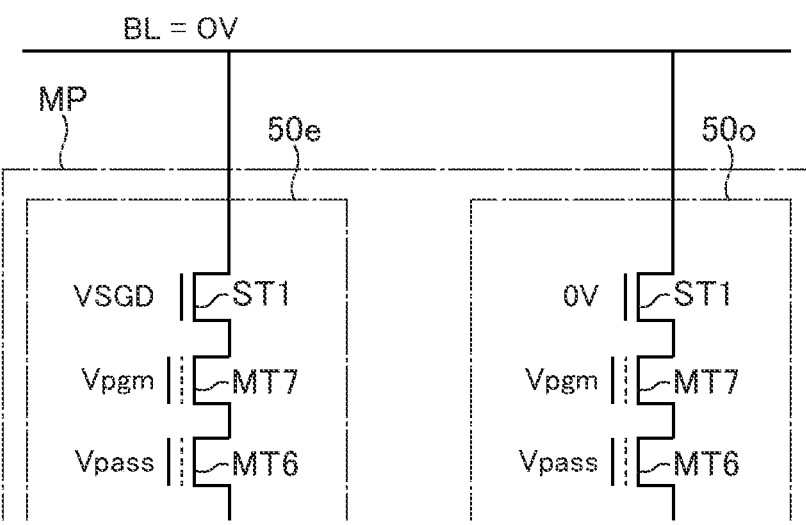
FIG. 18 is a schematic diagram showing a method of applying a voltage to a selection transistor and a memory cell transistor in a semiconductor memory device according to a first comparative form.
Figure 18:
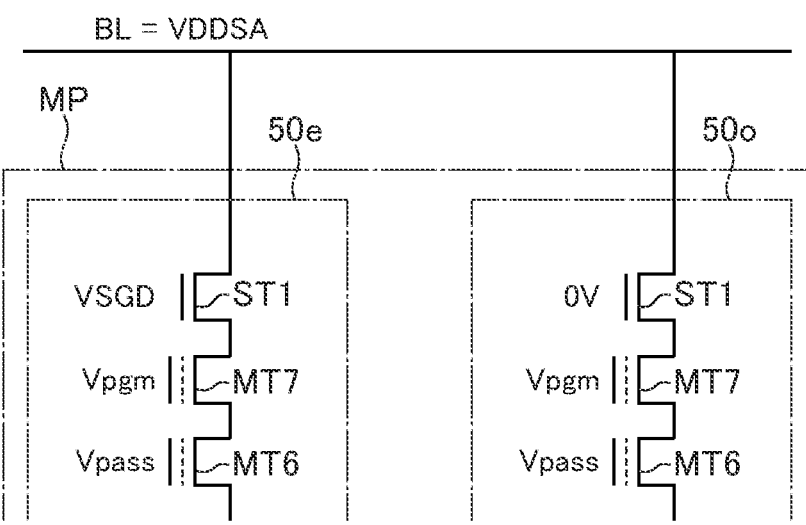

FIG. 18 is a schematic diagram showing a method of applying a voltage to the selection transistor ST and the memory cell transistor MT in a semiconductor memory device according to a first comparative form.

Here, a semiconductor memory device in which two NAND strings 50e and 50o are provided in one memory pillar MP is considered. In the semiconductor memory device considered herein, it is assumed that the dummy transistor DT is not provided.

In FIG. 18, two memory pillar MPs are shown, each having two NAND strings 50e and 50o. Here, the common select gate line SGD is connected to the gate of the selection transistor ST1 in the NAND string 50e in each memory pillar MP, and the common select gate line SGD is connected to the gate of the selection transistor ST1 in the NAND string 50o in each memory pillar MP. In addition, a common word line WL7e is connected to the gate of the memory cell transistor MT7 in the NAND string 50e in each memory pillar MP, and a common word line WL7o is connected to the gate of the memory cell transistor MT7 in the NAND string 50o in each memory pillar MP. Similarly, a common word line WL6e is connected to the gate of the memory cell transistor MT6 in the NAND string 50e in each memory pillar MP, and a common word line WL6o is connected to the gate of the memory cell transistor MT6 in the NAND string 50o in each memory pillar MP.

Here, the NAND string 50e connected to the bit line BL to which 0 V is applied is considered. In other words, the NAND string 50e connected to the "selected bit line BL" is considered. In this case, the voltage VSGD is applied from the select gate line SGD to the gate of the selection transistor ST1, and 0 V is applied from the bit line BL to the drain (or the source) of the selection transistor ST1. As a result, the selection transistor ST1 is turned on. The voltage VSGD is a higher voltage than VSS. The voltage VSGD is, for example, 2.5 V. The voltage VSS is, for example, a ground voltage. The voltage VSS is, for example, 0 V. However, the voltages VSGD and VSS are not particularly limited to these. In addition, the voltage Vpgm is applied from the word line WLe7 to the gate of the memory cell transistor MT7. The voltage Vpgm is, for example, 20 V. As a result, a high electric field is applied to the memory cell transistor MT7, and "0" data is written. On the other hand, the voltage Vpass is applied from the word line WLe6 to the gate of the memory cell transistor MT6. The voltage Vpass is, for example, 10 V. As a result, no high electric field is applied to the memory cell transistor MT6, and no data is written. Although not shown in FIG. 18, the voltage Vpass is applied from the word lines WLe5 to WLe0 to the memory cell transistors MT5 to MT0, respectively. No data is written to the memory cell transistors MT5 to MT0. In other words, in the NAND string 50e connected to the "selected bit line BL", "0" data is written only to the memory cell transistor MT7 corresponding to the selected word line WLe7.

Next, the NAND string 50e connected to the bit line BL to which a voltage VDDSA is applied is considered. In other words, the NAND string 50e connected to the "non-selected bit line BL" is considered. In this case, the voltage VSGD is applied to the gate of the selection transistor ST1 by using the select gate line SGD, and the voltage VDDSA is applied from the bit line BL to the drain (or the source) of the selection transistor ST1. As a result, the selection transistor ST1 is turned off. That is, the voltage VDDSA is a voltage at which the selection transistor ST1 is turned off when the voltage VSGD is applied to the selected common select gate line SGD. Conversely, the voltage VSGD is a voltage for turning on or off the selection transistor ST1 according to the voltage applied to the bit line BL. The voltage VDDSA is, for example, 2.5 V. However, the voltage VDDSA is not particularly limited to this. As described above, the common select gate line SGD, the common word line WLe7, and the common word line WLe6 are connected to the NAND string 50e in each memory pillar MP. Therefore, also in the NAND string 50e connected to the "non-selected bit line BL", the voltages VSGD, Vpgm, and Vpass are applied to the gate of the selection transistor ST1, the gate of the memory cell transistor MT7, and the gate of the memory cell transistor MT6, respectively. Here, in the NAND string 50e connected to the non-selected bit line BL to which the voltage VDDSA is applied, it is required that the selection transistor ST1 is turned off. However, the memory cell transistor MT7 and the selection transistor ST1 are adjacent to each other. When a relatively high voltage such as Vpgm is applied to the gate of the memory cell transistor MT adjacent to the selection transistor ST1, the potential of the channel of the selection transistor ST1 in the NAND string 50e on a side close to the memory cell transistor MT7 may transiently increase to Vpgm. In this case, the selection transistor ST1 in the NAND string 50e connected to the "non-selected bit line BL" may not be turned off properly due to the withstand voltage limit of the selection transistor ST1. In addition, since the channel potential of the selection transistor ST1 is reduced due to gate-induced drain leakage (GIDL), erroneous writing may occur in the memory cell transistor MT in the NAND string 50e connected to the "non-selected bit line BL". In other words, when writing is performed to the memory cell transistor MT7 connected to the uppermost word line (WLe7) in the NAND string 50e connected to the "selected bit line BL", an unexpected operation may occur in the selection transistor ST1 in the NAND string 50e connected to the "non-selected bit line BL" and the memory cell transistor MT7 connected to the corresponding word line (WLe7).

Figure 19:
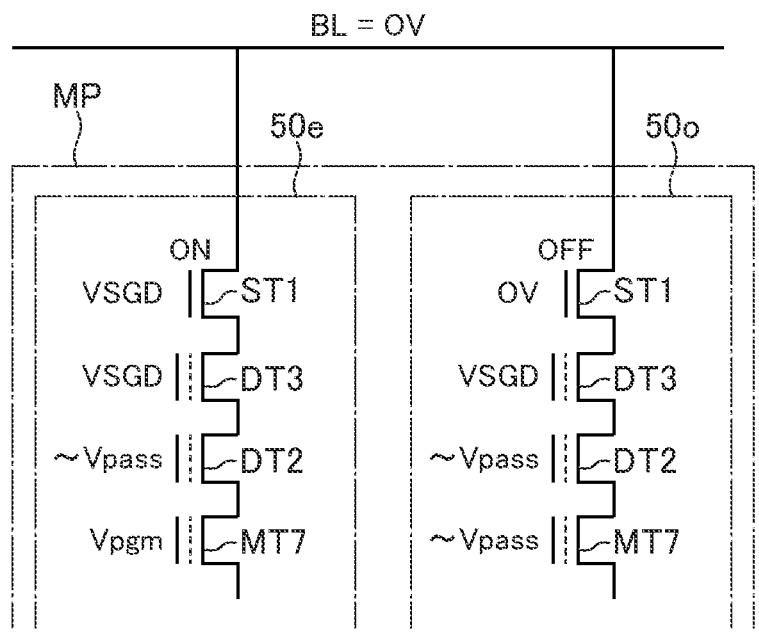
FIG. 19 is a schematic diagram showing a method of applying a voltage to a selection transistor and a memory cell transistor in a semiconductor memory device according to a second comparative form.
Figure 19:
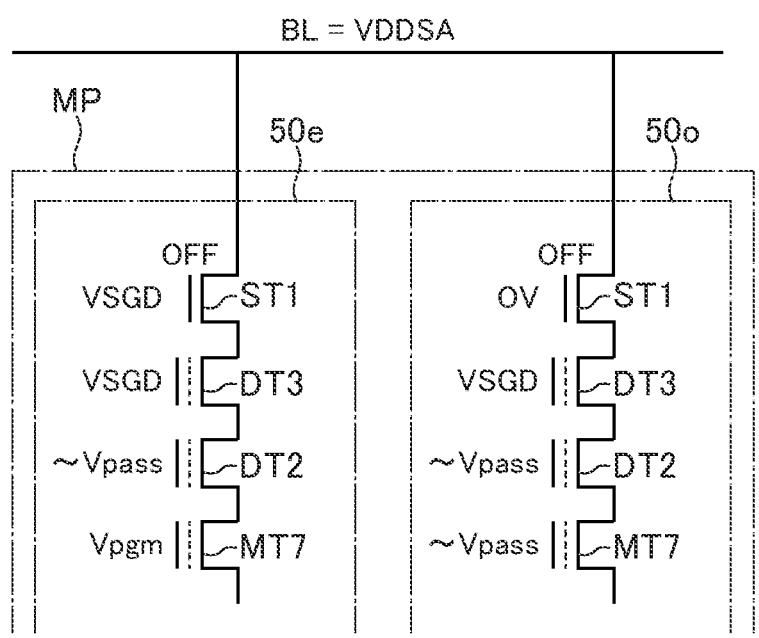

FIG. 19 is a schematic diagram showing a method of applying a voltage to a selection transistor and a memory cell transistor in a semiconductor memory device according to a second comparative form. Here, a semiconductor memory device in which two NAND strings 50e and 50o are provided in one memory pillar MP is considered. The bit line BL to which 0 V is applied is connected to the two NAND strings 50e and 50o provided in the same memory pillar MP. The bit line BL to which the voltage VDDSA is applied is also connected to the two NAND strings 50e and 50o provided in the same memory pillar MP. In addition, in each of the NAND strings 50e and 50o, it is assumed that the dummy transistors DT2 and DT3 are provided between the selection transistor ST1 and the memory cell transistor MT7.

A case where data is written to the memory cell transistor MT7 in the NAND string 50e corresponding to the selected word line WLe7 in each memory pillar MP will be described as an example. First, the NAND string 50e connected to the bit line BL to which 0 V is applied is considered. Since the voltage VSGD is applied from the select gate line SGD to the gate of the selection transistor ST1, the selection transistor ST1 is turned on. Data is written by applying the voltage Vpgm from the word line WLe7 selected in this state to the memory cell transistor MT7. In addition, it is assumed that the voltage Vpass is applied to the gate of the dummy transistor DT2 and the voltage VSGD is applied to the gate of the dummy transistor DT3. Here, for example, Vpgm>Vpass>VSGD>0 V. Unlike in the example of FIG. 18, the dummy transistor DT3 is arranged adjacent to the selection transistor ST1. The voltage VSGD is applied to the gate of the dummy transistor DT3 adjacent to the selection transistor ST1. Therefore, in the second comparative form, the potential of the channel of the selection transistor ST1 on the side close to the dummy transistor DT3 is unlikely to increase. As a result, it is possible to suppress the occurrence of GIDL. In addition, since the voltage Vpass is applied to the gate of the dummy transistor DT2 adjacent to the dummy transistor DT3, the potential between the selection transistor ST1 and the memory cell transistor MT7 gradually changes. As a result, it is possible to avoid a situation in which a voltage exceeding the withstand voltage limit is applied to the selection transistor ST1.

Next, the NAND string 50e connected to the bit line BL to which the voltage VDDSA is applied is considered. The voltage VSGD is also applied to the gate of the selection transistor ST1 in the NAND string 50e connected to the bit line BL to which the voltage VDDSA is applied. In addition, the voltage Vpgm is applied to the memory cell transistor MT7. However, the voltage Vpass is applied to the gate of the dummy transistor DT2 and the voltage VSGD is applied to the gate of the dummy transistor DT3. Therefore, it is possible to suppress the occurrence of GIDL as in the case of the NAND string 50e connected to the bit line BL to which 0 V is applied. In addition, it is possible to avoid a situation in which a voltage exceeding the withstand voltage limit is applied to the selection transistor ST1.

FIGS. 20A to 20D are schematic diagrams showing a method of applying a voltage to the selection transistor ST and the memory cell transistor MT in the semiconductor memory device according to embodiments. In the first comparative form and the second comparative form described above, it is considered to apply the same voltage to the gates of the dummy transistors DT2 and DT3 in the NAND string 50e and the NAND string 50o. In embodiments, however, different voltages are applied to the dummy transistors DT2 and DT3 in the NAND string 50e and the NAND string 50o.

Figure 20A:
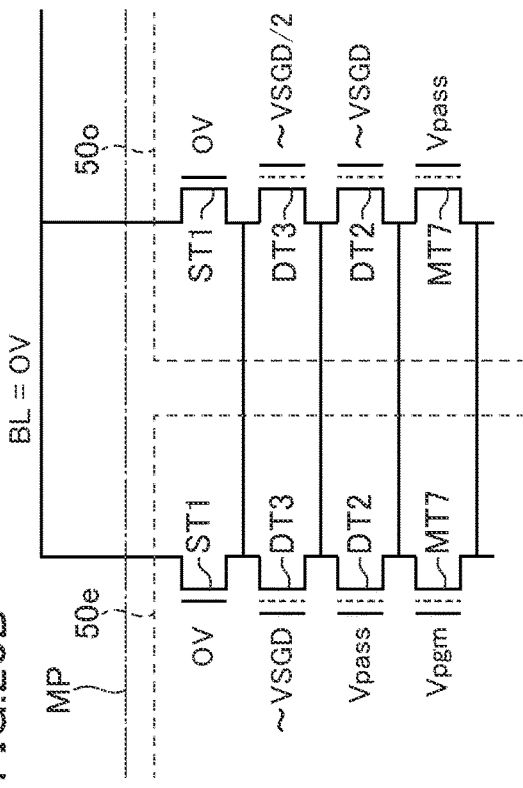
FIGS. 20A to 20D are schematic diagrams showing a method of applying a voltage to a selection transistor and a memory cell transistor in the semiconductor memory device according to the first embodiment.

In the schematic diagram shown in FIG. 20A, 0 V is applied to the bit line BL. The voltage VSGD is applied from the select gate line SGD (an example of the first select gate line) to the gate of the selection transistor ST1 in the NAND string 50e. 0 V is applied to the gate of the selection transistor ST1 in the NAND string 50o by using the select gate line SGD (an example of the second select gate line SGD). The voltage VSGD is applied from a dummy word line (an example of the first dummy word line on the uppermost layer) to the gate of the dummy transistor DT3 in the NAND string 50e. The voltage VSGD/2 is applied from a dummy word line (an example of the second dummy word line on the uppermost layer) to the gate of the dummy transistor DT3 in the NAND string 50o. The voltage Vpass is applied from a dummy word line (an example of the first dummy word line on the lowermost layer) to the gate of the dummy transistor DT2 in the NAND string 50e. The voltage VSGD is applied from a dummy word line (an example of the second dummy word line on the lowermost layer) to the gate of the dummy transistor DT2 of the NAND string 50o. The voltage Vpgm is applied from a word line (an example of the first word line on the uppermost layer) to the gate of the memory cell transistor MT7 in the NAND string 50e. The voltage Vpass is applied from a word line (an example of the second word line on the uppermost layer) to the gate of the memory cell transistor MT7 in the NAND string 50o.

That is, in the NAND string 50o that is not a writing target, the voltage applied to the gate of the dummy transistor DT3 is VSGD/2, which is even lower than that (VSGD) in the case shown in FIG. 19. Therefore, the potential of the channel of the selection transistor ST1 in the NAND string 50o that is not a writing target, which is on a side close to the dummy transistor DT3, becomes lower than that in the second comparative form of FIG. 19. As a result, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

Figure 20B:
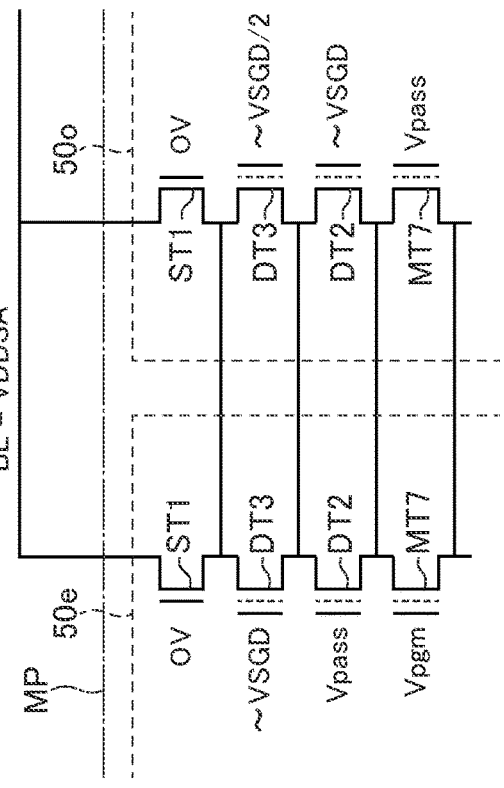

In the schematic diagram shown in FIG. 20B, 0 V is applied to the gate of the selection transistor ST in the NAND string 50e by using the select gate line SGD (an example of the third select gate line). In addition, 0 V is applied to the gate of the selection transistor ST in the NAND string 50o by using the select gate line SGD (an example of the fourth select gate line). In addition, the selection transistor ST1 in the NAND string 50e shown in FIG. 20B and the selection transistor ST1 in the NAND string 50e shown in FIG. 20A are connected to different select gate lines. That is, the NAND string 50e shown in FIG. 20A and the NAND string 50e shown in FIG. 20B belong to different string units. In addition, the selection transistor ST1 in the NAND string 50o shown in FIG. 20B and the selection transistor ST1 in the NAND string 50o shown in FIG. 20A are connected to different select gate lines. That is, the NAND string 50o shown in FIG. 20A and the NAND string 50o shown in FIG. 20B belong to different string units. Other points are the same as the schematic diagram shown in FIG. 20A. Also in this case, the voltage applied to the gate of the dummy transistor DT3 in the NAND string 50o, which is not a writing target, is VSGD/2. Therefore, the potential of the channel of the selection transistor ST1 in the NAND string 50o that is not a writing target, which is on a side close to the dummy transistor DT3, becomes lower than that in the second comparative form of FIG. 19. As a result, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

Figure 20C:
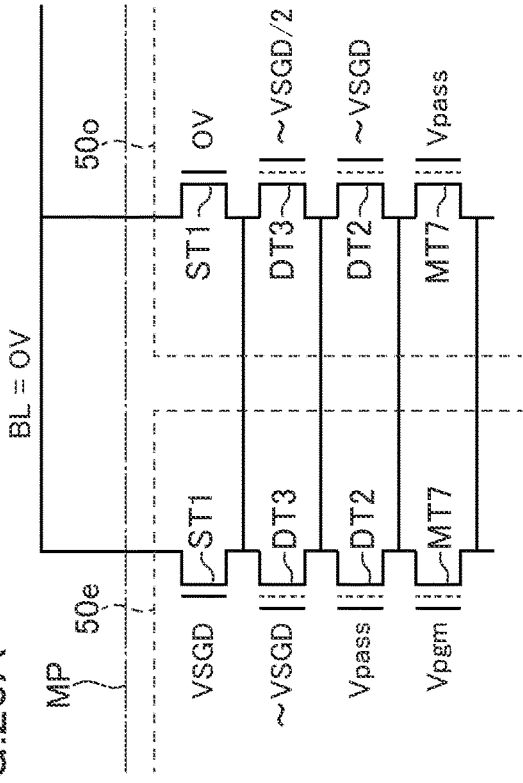

In the schematic diagram shown in FIG. 20C, the voltage VDDSA is applied to the bit line BL. The selection transistor ST1 in the NAND string 50e shown in FIG. 20C and the selection transistor ST1 in the NAND string 50e shown in FIG. 20A are connected to a common select gate line (first select gate line). That is, the NAND string 50e shown in FIG. 20A and the NAND string 50e shown in FIG. 20C belong to the same string unit. In addition, the selection transistor ST1 in the NAND string 50o shown in FIG. 20C and the selection transistor ST1 in the NAND string 50o shown in FIG. 20A are connected to a common select gate line (second select gate line). That is, the NAND string 50o shown in FIG. 20A and the NAND string 50o shown in FIG. 20C belong to the same string unit. Therefore, the schematic diagram shown in FIG. 20C is the same as the schematic diagram shown in FIG. 20A except for the voltage of the bit line BL. Also in this case, the voltage applied to the gate of the dummy transistor DT3 in the NAND string 50o, which is not a writing target, is VSGD/2. Therefore, the potential of the channel of the selection transistor ST1 in the NAND string 50o that is not a writing target, which is on a side close to the dummy transistor DT3, becomes lower than that in the second comparative form of FIG. 19. As a result, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

Figure 20D:
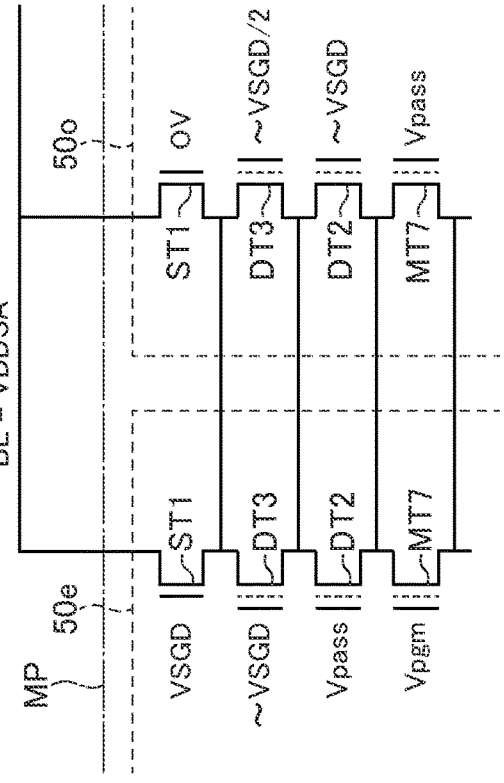

In the schematic diagram shown in FIG. 20D, the voltage VDDSA is applied to the bit line BL. The selection transistor ST1 in the NAND string 50e shown in FIG. 20D and the selection transistor ST1 in the NAND string 50e shown in FIG. 20B are connected to a common select gate line (third select gate line). That is, the NAND string 50e shown in FIG. 20B and the NAND string 50e shown in FIG. 20D belong to the same string unit. In addition, the selection transistor ST1 in the NAND string 50o shown in FIG. 20D and the selection transistor ST1 in the NAND string 50o shown in FIG. 20B are connected to a common select gate line (fourth select gate line). That is, the NAND string 50o shown in FIG. 20B and the NAND string 50o shown in FIG. 20D belong to the same string unit. Therefore, the schematic diagram shown in FIG. 20D is the same as the schematic diagram shown in FIG. 20B except for the voltage of the bit line BL. Also in this case, the voltage applied to the gate of the dummy transistor DT3 in the NAND string 50o, which is not a writing target, is VSGD/2. Therefore, the potential of the channel of the selection transistor ST1 in the NAND string 50o that is not a writing target, which is on a side close to the dummy transistor DT3, becomes lower than that in the second comparative form of FIG. 19. As a result, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

Figure 21:
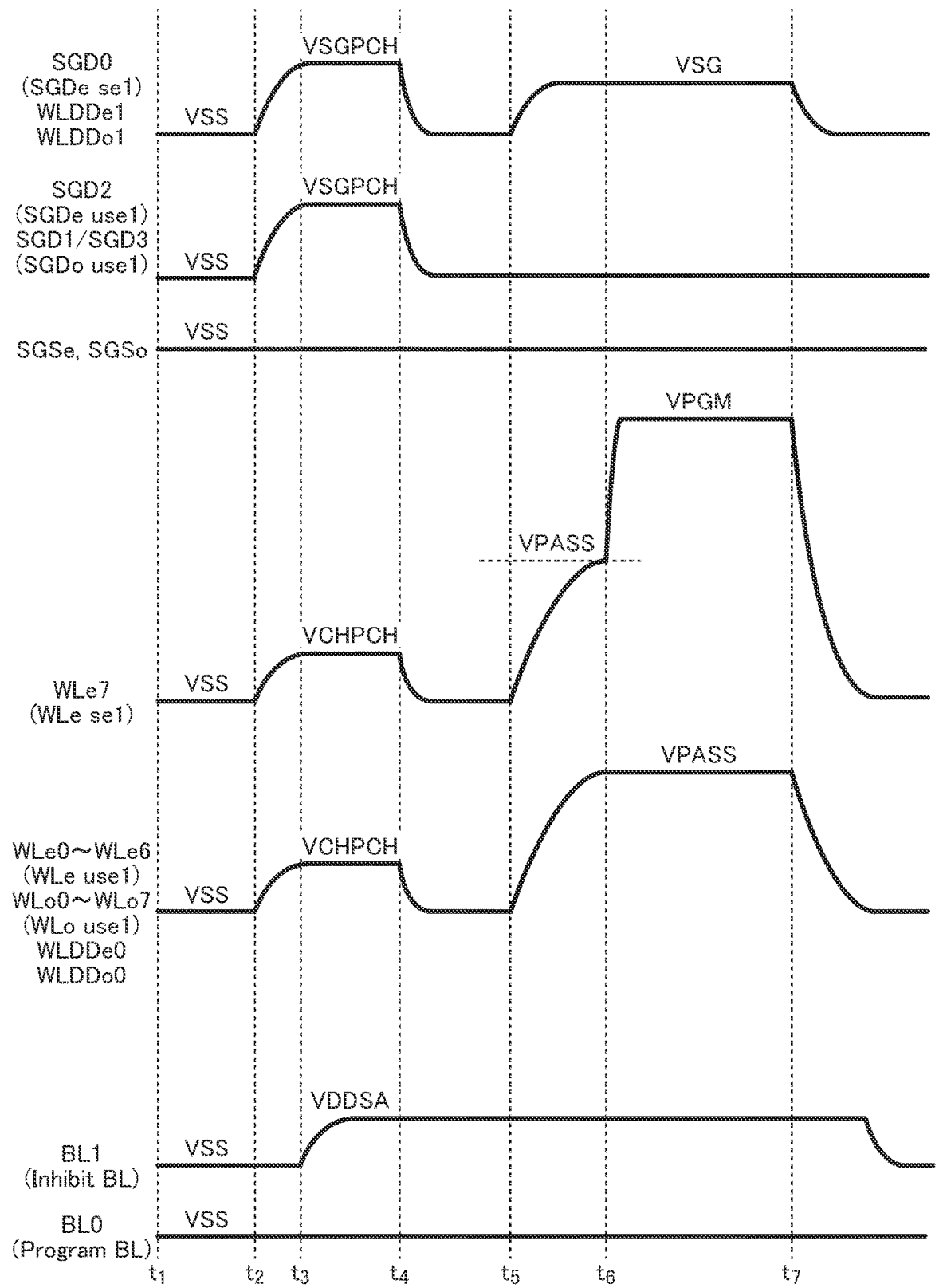
FIG. 21 is a diagram schematically showing a voltage applied to a selection transistor in a memory pillar (two NAND strings adjacent to each other) through a select gate line and a voltage applied to a memory cell transistor in the memory pillar through a word line and a dummy word line in a semiconductor memory device according to a comparative form.

FIG. 21 is a diagram schematically showing a voltage applied to a selection transistor in the memory pillar MP (two NAND strings adjacent to each other) through a select gate line and a voltage applied to a memory cell transistor in the memory pillar through a word line and a dummy word line in a semiconductor memory device according to a comparative form. Here, it is assumed that the memory cell transistor MT7 in the NAND string 50e having the select gate line SGD0 in the memory pillar MP3 shown in FIG. 5 is a writing target.

First, it is assumed that, between the times t1 and t2, the voltages of the select gate line SGD0 (SGDe sel1), the dummy word line WLDDe1, the dummy word line WLDDe0, the select gate line SGD2 (SGDe use1), the select gate line SGD1, the select gate line SGD3 (SGDo use1), the select gate line SGSe, the select gate line SGSo, the word line WLe7 (WLe se1), the word lines WLe0 to WLe6 (WLe use1) and WLo0 to WLo7 (WLo use1), the dummy word line WLDDe0, the dummy word line WLDDe1, the bit line BL1 (Inhibit BL), and the bit line BL0 (Program BL) are VSS.

At time t2, a precharge voltage VSGPCH is applied to the select gate line SGD0 (SGDe se1), the dummy word line WLDDe1, the dummy word line WLDDo1, the select gate line SGD2 (SGDe use1), the select gate line SGD1, and the select gate line SGD3 (SGDo use1). In addition, a precharge voltage VCHPCH is applied to the word line WLe7 (WLe se1), the word lines WLe0 to WLe6 (WLe use1) and WLo0 to WLo7 (WLo use1), the dummy word line WLDDe0, and the dummy word line WLDDo0. The precharge voltages VSGPCH and VCHPCH are higher than, for example, VSS.

At time t3, the voltage VDDSA is applied to the bit line BL1 (Inhibit BL).

At time t4, the precharge voltage VSGPCH applied to the select gate line SGD0 (SGDe se1), the dummy word line WLDDe1, the dummy word line WLDDo1, the select gate line SGD2 (SGDe use1), the select gate line SGD1, and the select gate line SGD3 (SGDo use1) is returned to the voltage VSS. In addition, the precharge voltage VCHPCH applied to the word line WLe7 (WLe se1), the word lines WLe0 to WLe6 (WLe use1) and WLo0 to WLo7 (WLo use1), the dummy word line WLDDe0, and the dummy word line WLDDo0 is returned to the voltage VSS.

At time t5, the voltage VSG is applied to the select gate line SGD0 (SGDe se1), the dummy word line WLDDe1, and the dummy word line WLDDo1. In addition, the voltage Vpass is applied to the word line WLe7 (WLe se1), the word lines WLe0 to WLe6 (WLe use1) and WLo0 to WLo7 (WLo use1), the dummy word line WLDDe0, and the dummy word line WLDDo0. In addition, at time t6, the voltage Vpgm is applied to the word line WLe7 (WLe se1).

At time t7, the voltage VSS is applied to the select gate line SGD0 (SGDe se1), the dummy word line WLDDe1, the dummy word line WLDDo1, the word line WLe7 (WLe se1), the word lines WLe0 to WLe6 (WLe use1) and WLo0 to WLo7 (WLo use1), the dummy word line WLDDe0, and the dummy word line WLDDo0.

In the case of embodiments shown in FIG. 21, as described above, the memory cell transistor MT7 in the NAND string 50e having the select gate line SGD0 in the memory pillar MP3 is a writing target. On the other hand, the voltage Vpgm is also applied to the gate of the memory cell transistor MT7 in the NAND string 50e of the memory pillar MP0, the memory pillar MP1 and the memory pillar MP2. However, this is not a writing target.

Figure 22:
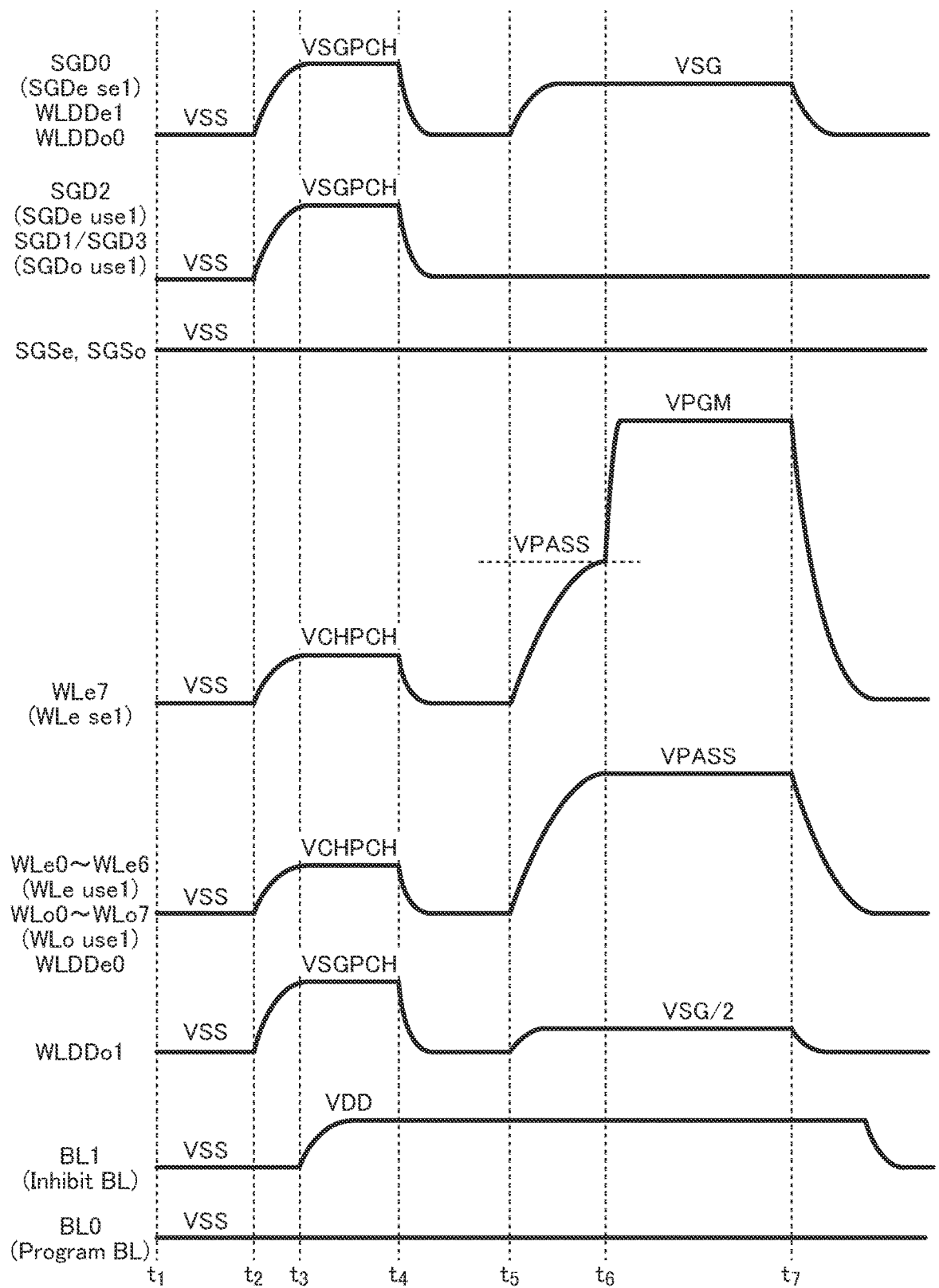
FIG. 22 is a diagram schematically showing a voltage applied to a selection transistor in a memory pillar (two NAND strings adjacent to each other) through a select gate line and a voltage applied to a memory cell transistor in the memory pillar through a word line and a dummy word line in the semiconductor memory device according to the first embodiment.

FIG. 22 is a diagram schematically showing a voltage applied to a selection transistor in a memory pillar (two NAND strings adjacent to each other) through a select gate line and a voltage applied to a memory cell transistor in the memory pillar through a word line and a dummy word line in the semiconductor memory device according to embodiments. Here, the voltage applied to the dummy word line WLDDe1 and the voltage applied to the dummy word line WLDDo1 are different. In addition, the voltage applied to the dummy word line WLDDe0 and the voltage applied to the dummy word line WLDDo0 are different.

The voltage applied to the dummy word line WLDDe1 and the dummy word line WLLDeO is the same as in the case of the semiconductor memory device shown in FIG. 21.

On the other hand, the voltage VSG/2 lower than the voltage VSG is applied to the dummy word line WLDDo1 at time t5. In addition, the voltage VSG lower than the voltage Vpass is applied to the dummy word line WLDDo0 at time t5. As a result, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

Second Embodiment

Figure 23:
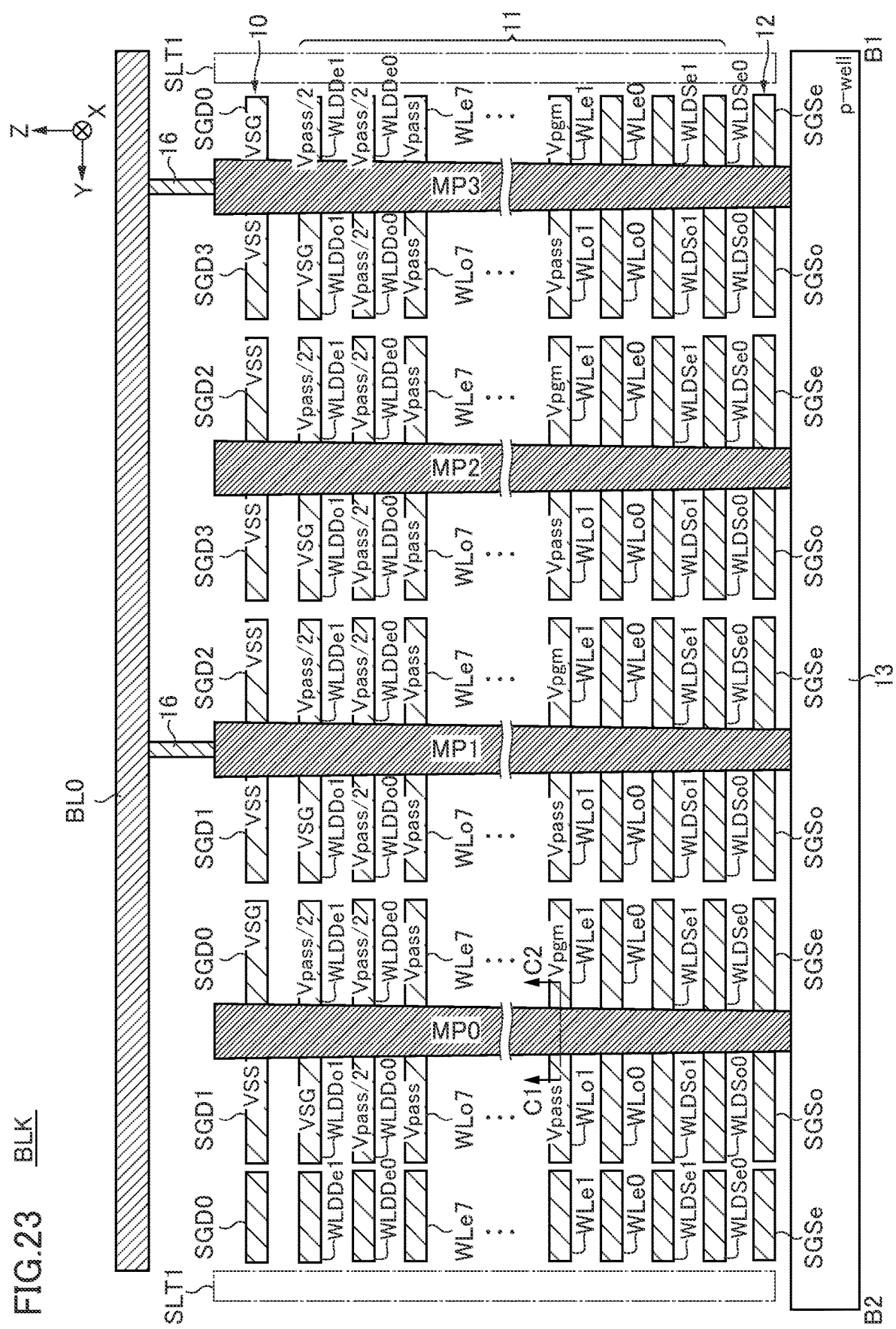
FIG. 23 is a diagram schematically showing a voltage applied to a selection transistor in a memory pillar (two NAND strings adjacent to each other) through a select gate line and a voltage applied to a memory cell transistor in the memory pillar through a word line and a dummy word line in a semiconductor memory device according to a second embodiment.

FIG. 23 is a diagram schematically showing a voltage applied to a selection transistor through a select gate line and a voltage applied to a memory cell transistor in a memory pillar through a word line and a dummy word line in a semiconductor memory device according to embodiments. Embodiments show the operation of the semiconductor memory device when the memory cell transistor MT connected to a word line other than the word line WL (WLe7) on the uppermost layer is a writing target. Specifically, embodiments show the operation when the memory cell transistor MT1 connected to the word line WLe1 in the NAND string 50e in the memory pillar MP3 is a writing target. In addition, the voltage shown in FIG. 23 corresponds to the voltage applied at time t6.

The voltage VSG is applied to the dummy word line WLDDo1. The voltage Vpass/2 is applied to the dummy word lines WLDDe1, WLDDe0, and WLDDo0. The voltage Vpgm is applied to the word line WLe1. On the other hand, the voltage Vpass is applied to the word lines WLe0, WLe2 to WLe7, and WLo0 to WLo7.

In the semiconductor memory device of embodiments, the voltages applied to the dummy word line WLDDo1 and the dummy word line WLDDe1 are different. In addition, the voltages applied to the dummy word line WLDDo0 and the dummy word line WLDDe0 are the same. As a result, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

Third Embodiment

Figure 24:
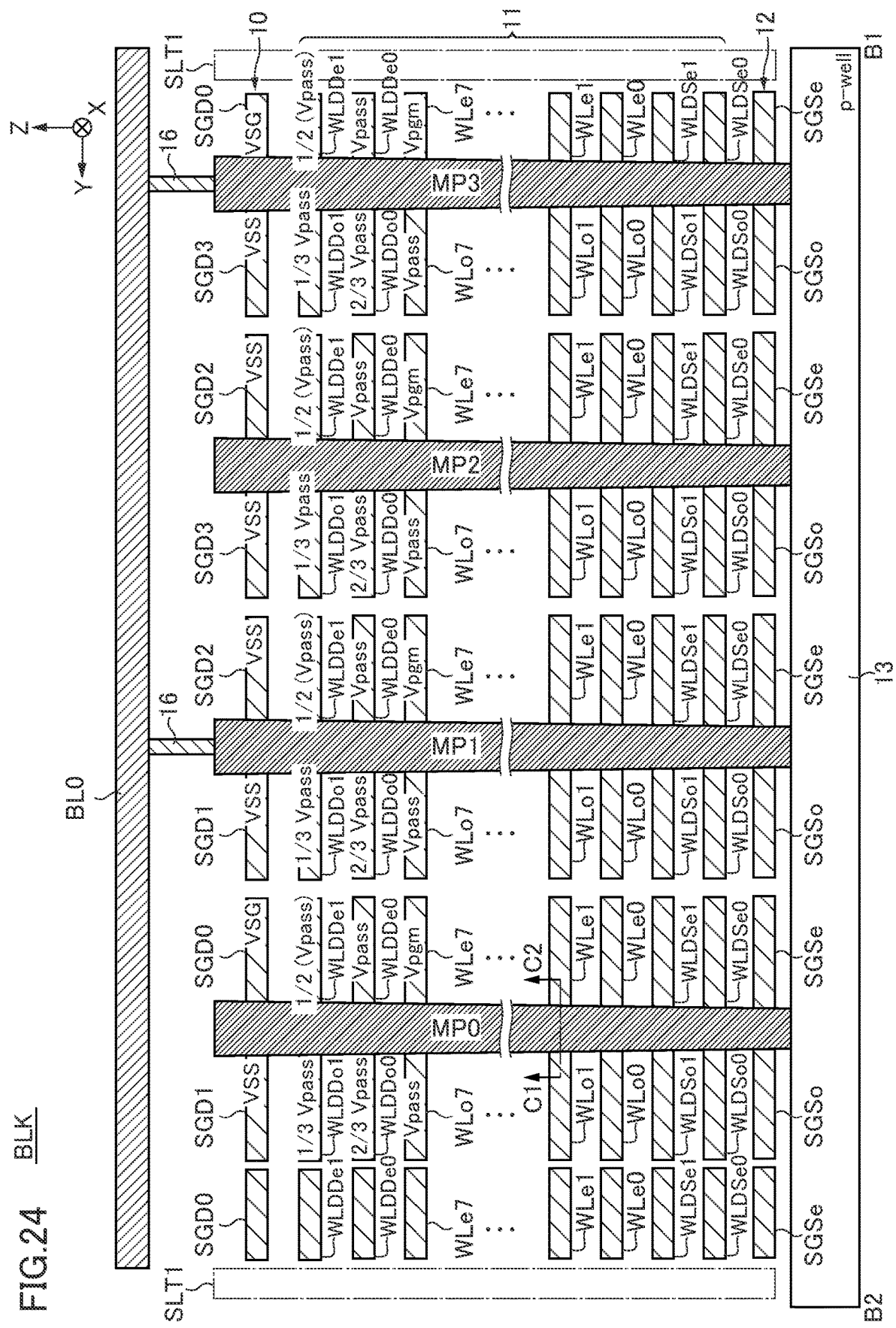
FIG. 24 is a diagram schematically showing a voltage applied to a selection transistor in a memory pillar (two NAND strings adjacent to each other) through a select gate line and a voltage applied to a memory cell transistor in the memory pillar through a word line and a dummy word line in a semiconductor memory device according to a third embodiment.

FIG. 24 is a diagram schematically showing a voltage applied to a selection transistor through a select gate line and a voltage applied to a memory cell transistor in a memory pillar through a word line and a dummy word line in a semiconductor memory device according to embodiments. Embodiments show the operation of the semiconductor memory device when the memory cell transistor MT7 connected to the word line WL (WLe7) on the uppermost layer is a writing target. Specifically, embodiments show the operation when the memory cell transistor MT7 connected to the word line WLe7 in the NAND string 50e in the memory pillar MP3 is a writing target. In addition, the voltage shown in FIG. 24 corresponds to the voltage applied at time t6.

(1/3)Vpass is applied to the dummy word line WLDDo1.
(2/3)Vpass is applied to the dummy word line WLDDo0.
(1/2) (Vpass) is applied to the dummy word line WLDDe1.
The voltage Vpass is applied to the dummy word line WLDDe0. The voltage Vpgm is applied to the word line WLe7. On the other hand, the voltage Vpass is applied to the word lines WLe0 to WLe6 and WLo0 to WLo7.

In the semiconductor memory device of embodiments, the voltages applied to the dummy word line WLDDo1 and the dummy word line WLDDe1 are different. In addition, the voltages applied to the dummy word line WLDDo0 and the dummy word line WLDDe0 are different. As a result, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

Fourth Embodiment

Figure 25:
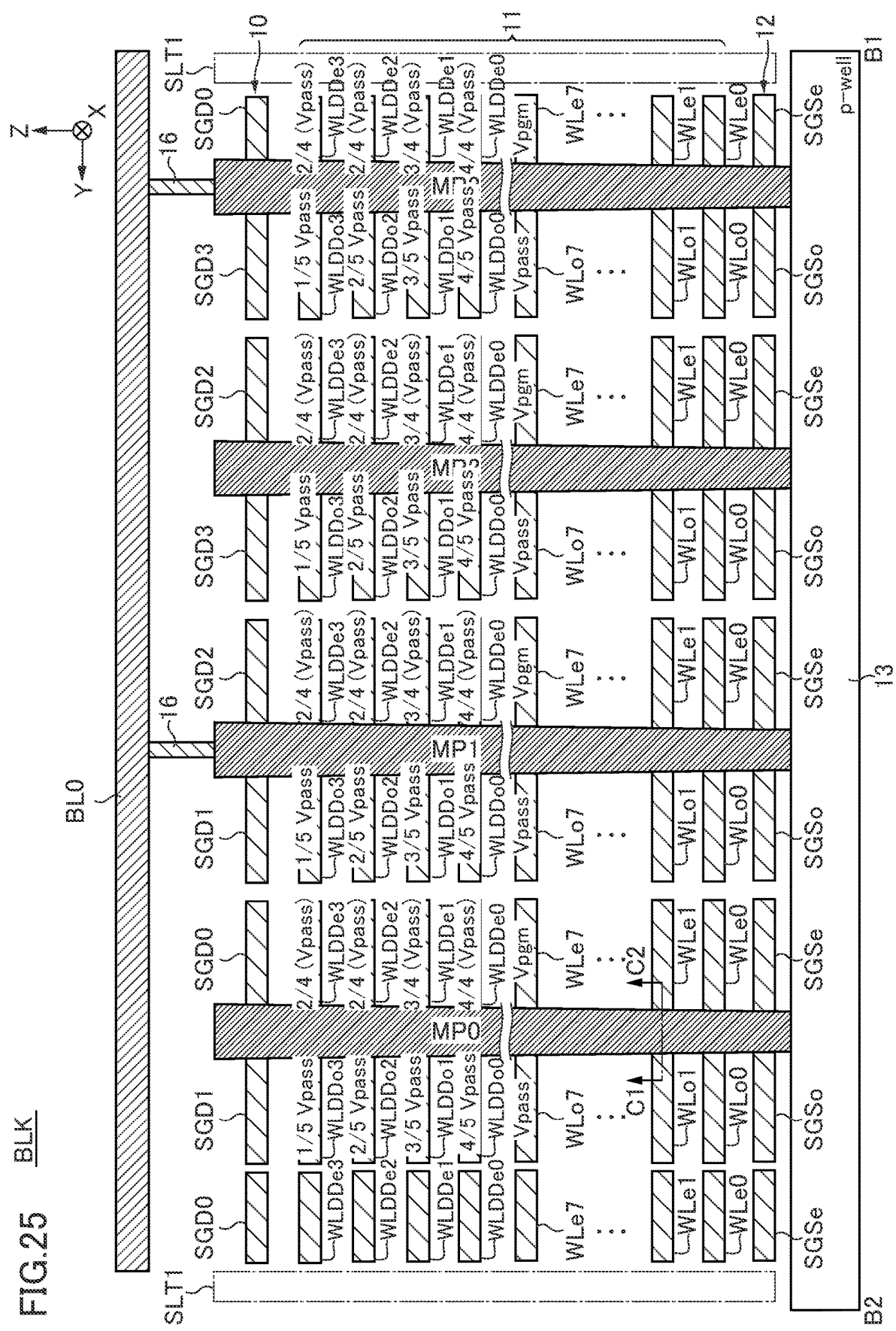
FIG. 25 is a diagram schematically showing a voltage applied to a selection transistor in a memory pillar (two NAND strings adjacent to each other) through a select gate line and a voltage applied to a memory cell transistor in the memory pillar through a word line and a dummy word line in a semiconductor memory device according to a fourth embodiment.

FIG. 25 is a diagram schematically showing a voltage applied to a selection transistor through a select gate line and a voltage applied to a memory cell transistor in a memory pillar through a word line and a dummy word line in a semiconductor memory device according to embodiments. Embodiments show the operation of the semiconductor memory device when the memory cell transistor MT7 connected to the word line WL (WLe7) on the uppermost layer is a writing target. Specifically, embodiments show the operation when the memory cell transistor MT7 connected to the word line WLe7 in the NAND string 50e in the memory pillar MP3 is a writing target. In addition, in the semiconductor memory device according to embodiments, four dummy word lines WLD are provided in each NAND string 50. In addition, the voltage shown in FIG. 25 corresponds to the voltage applied at time t6.

(1/5)Vpass is applied to the dummy word line WLDDo3.
(2/5)Vpass is applied to the dummy word line WLDDo2.
(3/5)Vpass is applied to the dummy word line WLDDo1.
(4/5)Vpass is applied to the dummy word line WLDDo0.
(2/4) (Vpass) is applied to the dummy word line WLDDe3.
(2/4) (Vpass) is applied to the dummy word line WLDDe2.
(3/4) (Vpass) is applied to the dummy word line WLDDe1.
(4/4) (Vpass) is applied to the dummy word line WLDDe0.

Also in the semiconductor memory device of embodiments, it is possible to more reliably suppress the occurrence of GIDL in the NAND string 50o that is not a writing target. In addition, it is possible to more reliably avoid a situation in which a voltage exceeding the withstand voltage limit is applied to the selection transistor ST1. Therefore, it is possible to provide a semiconductor memory device with improved reliability.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor memory device, comprising:
a substrate;
a memory pillar extending in a first direction from the substrate and having a first side and a second side opposite to the first side;

a plurality of first word lines provided with intervals along the first direction above the substrate and each extending in parallel with a substrate surface of the substrate to face the first side of the memory pillar;

a plurality of second word lines provided with intervals along the first direction above the substrate and each extending in parallel with the substrate surface of the substrate to face the second side of the memory pillar, the plurality of second word lines and the plurality of first word lines being equidistant from the substrate surface in the first direction;

a plurality of first dummy word lines provided with intervals in the first direction above the first word lines and each extending in parallel to the substrate surface of the substrate to face the first side of the memory pillar;

a plurality of second dummy word lines provided with intervals in the first direction above the second word lines and each extending in parallel to the substrate surface of the substrate to face the second side of the memory pillar, the second dummy word lines and the first dummy word lines being equidistant from the substrate surface in the first direction;

a first select gate line provided above the plurality of first dummy word lines and extending in parallel to the substrate surface of the substrate to face the first side of the memory pillar;

a second select gate line provided above the plurality of second dummy word lines and extending in parallel to the substrate surface of the substrate to face the second side of the memory pillar, the second select gate line and the first select gate line being equidistant from the substrate surface in the first direction; and a driver configured to supply a voltage, wherein, in a write operation, the driver:
applies a first voltage to the first select gate line,
applies a second voltage lower than the first voltage to the second select gate line,
applies a third voltage equal to or higher than the first voltage to a first dummy word line on an uppermost layer from among the plurality of first dummy word lines,
applies a fourth voltage different from the third voltage and higher than the second voltage to a second dummy word line on an uppermost layer from among the plurality of second dummy word lines,
applies a fifth voltage equal to or higher than the third voltage to a first dummy word line on a lowermost layer from among the plurality of first dummy word lines, and
applies a sixth voltage different from the fifth voltage and equal to or higher than the fourth voltage to a second dummy word line on a lowermost layer from among the plurality of second dummy word lines.

2. The semiconductor memory device according to claim 1, wherein the third voltage and the sixth voltage are equal.

3. The semiconductor memory device according to claim 1, wherein:
in the write operation, the driver applies a seventh voltage higher than the fifth and sixth voltages to a first word line on an uppermost layer from among the plurality of first word lines, and applies an eighth voltage lower than the seventh voltage and higher than the sixth voltage to a second word line on an uppermost layer from among the plurality of second word lines;
the first voltage, the third voltage, and the sixth voltage are equal; and
the fifth voltage and the eighth voltage are equal.

4. The semiconductor memory device according to claim 1, wherein:
in the write operation, the driver applies a seventh voltage higher than the fifth and sixth voltages to a first word line on an uppermost layer from among the plurality of first word lines, and applies an eighth voltage lower than the seventh voltage and higher than the sixth voltage to a second word line on an uppermost layer from among the plurality of second word lines;
n layers of the first dummy word lines and n layers of the second dummy word lines are provided (n is a natural number of 2 or more);
the fourth voltage is $1/(n+1)$ of the eighth voltage; and
the sixth voltage is $n/(n+1)$ of the eighth voltage.

5. The semiconductor memory device according to claim 1, wherein the memory pillar and each of the plurality of first word lines forms a memory cell transistor, and the memory pillar and each of the plurality of second word lines forms a memory cell transistor.

6. The semiconductor memory device according to claim 5, further comprising:
a second memory pillar extending in the first direction from the substrate and having a third side and a fourth side opposite to the third side;
a third select gate line extending in parallel to the substrate surface of the substrate; and
a fourth select gate line extending in parallel to the substrate surface of the substrate,
wherein:
each of the plurality of first word lines faces the third side of the second memory pillar,
each of the plurality of second word lines faces the fourth side of the second memory pillar,
each of the plurality of first dummy word lines faces the third side of the second memory pillar,
each of the plurality of second dummy word lines faces the fourth side of the second memory pillar,
the third select gate line faces the third side of the second memory pillar,
the fourth select gate line faces the fourth side of the second memory pillar, and
in the write operation, the driver applies an eleventh voltage lower than the first voltage to the third select gate line, and applies a twelfth voltage lower than the first voltage to the fourth select gate line.

7. The semiconductor memory device according to claim 6, wherein the second memory pillar and each of the plurality of first word lines forms a memory cell transistor, and the second memory pillar and each of the plurality of second word lines forms a memory cell transistor.

8. The semiconductor memory device according to claim 7, further comprising:
a bit line connected to the memory pillar and the second memory pillar.

9. The semiconductor memory device according to claim 8, wherein, in the write operation, the driver applies a thirteenth voltage higher than the fifth voltage and the sixth voltage to a selected one of the plurality of first word lines, thereby writing data into the memory cell transistor formed by the selected one of the plurality of first word lines and the memory pillar while each remaining unselected memory cell transistor is not written with data.

10. A semiconductor memory device, comprising:
a substrate;
a memory pillar extending in a first direction from the substrate and having a first side and a second side opposite to the first side;
a plurality of first word lines provided with intervals along the first direction above the substrate and each extending in parallel with a substrate surface of the substrate to face the first side of the memory pillar;
a plurality of second word lines provided with intervals along the first direction above the substrate and each extending in parallel with the substrate surface of the substrate to face the second side of the memory pillar, the plurality of second word lines and the plurality of first word lines being equidistant from the substrate surface in the first direction;
a plurality of first dummy word lines provided with intervals in the first direction above the first word lines and each extending in parallel to the substrate surface of the substrate to face the first side of the memory pillar;
a plurality of second dummy word lines provided with intervals in the first direction above the second word lines and each extending in parallel to the substrate surface of the substrate to face the second side of the memory pillar, the second dummy word lines and the first dummy word lines being equidistant from the substrate surface in the first direction;
a first select gate line provided above the plurality of first dummy word lines and extending in parallel to the substrate surface of the substrate to face the first side of the memory pillar;
a second select gate line provided above the plurality of second dummy word lines and extending in parallel to the substrate surface of the substrate to face the second side of the memory pillar, the second select gate line and the first select gate line being equidistant from the substrate surface in the first direction; and
a driver configured to supply a voltage,
wherein, in a write operation, the driver:
applies a first voltage to the first select gate line,
applies a second voltage lower than the first voltage to the second select gate line,
applies a third voltage equal to or higher than the first voltage to a first dummy word line on an uppermost layer from among the plurality of first dummy word lines,
applies a fourth voltage different from the third voltage and higher than the second voltage to a second dummy word line on an uppermost layer from among the plurality of second dummy word lines,
applies a fifth voltage equal to or higher than the third voltage to a first dummy word line on a lowermost layer from among the plurality of first dummy word lines,
applies a sixth voltage equal to or higher than the fourth voltage to a second dummy word line on a lowermost layer from among the plurality of second dummy word lines,
applies a seventh voltage higher than the fifth and sixth voltages to a first word line on an uppermost layer from among the plurality of first word lines, and
applies an eighth voltage higher than the fifth and sixth voltages to a second word line on an uppermost layer from among the plurality of second word lines,
wherein the first voltage and the fourth voltage are equal; and
wherein the third voltage, the fifth voltage, and the sixth voltage are equal.

11. The semiconductor memory device according to claim 10, wherein, in the write operation, the driver applies a ninth voltage higher than the seventh voltage to one of the plurality of first word lines other than the first word line on the uppermost layer, and applies a tenth voltage higher than the fifth and sixth voltages and lower than the ninth voltage to each of the plurality of second word lines.

* * * * *